(12) United States Patent
Jung

(10) Patent No.: US 11,055,099 B2
(45) Date of Patent: Jul. 6, 2021

(54) BRANCH LOOK-AHEAD INSTRUCTION DISASSEMBLING, ASSEMBLING, AND DELIVERING SYSTEM APPARATUS AND METHOD FOR MICROPROCESSOR SYSTEM

(71) Applicant: Yong-Kyu Jung, Fairview, PA (US)

(72) Inventor: Yong-Kyu Jung, Fairview, PA (US)

(73) Assignee: Yong-Kyu Jung, Erie, PA (US)

(*) Notice: Subject to any disclaimer, the term of this patent is extended or adjusted under 35 U.S.C. 154(b) by 319 days.

(21) Appl. No.: 16/278,148

(22) Filed: Feb. 17, 2019

(65) Prior Publication Data

US 2019/0235874 A1 Aug. 1, 2019

Related U.S. Application Data

(63) Continuation of application No. 14/735,147, filed on Jun. 10, 2015, now abandoned.

(51) Int. Cl.
*G06F 9/38* (2018.01)
*H03K 17/687* (2006.01)
(Continued)

(52) U.S. Cl.
CPC ........ *G06F 9/3806* (2013.01); *G06F 9/30058* (2013.01); *G06F 9/325* (2013.01);
(Continued)

(58) Field of Classification Search
None
See application file for complete search history.

(56) References Cited

U.S. PATENT DOCUMENTS 5,509,130 A * 4/1996 Trauben ............... G06F 9/3804
712/215
5,742,804 A * 4/1998 Yeh .................... G06F 9/3804
712/207
(Continued)

FOREIGN PATENT DOCUMENTS

JP 2016528641 A * 9/2016 ......... G06F 12/0875
WO WO-2014113741 A1 * 7/2014 ............ G06F 9/383
WO WO-2016160630 A1 * 10/2016 ............ G06F 9/325

OTHER PUBLICATIONS

'Increasing the Lookahead of Multilevel Branch Prediction' by Alexander V. Veidenbaum, copyright 1999, IEEE. (Year: 1999).*
(Continued)

*Primary Examiner* — Steven G Snyder

(57) ABSTRACT

A method and system of the branch look-ahead (BLA) instruction disassembling, assembling, and delivering are designed for improving speed of branch prediction and instruction fetch of microprocessor systems by reducing the amount of clock cycles required to deliver branch instructions to a branch predictor located inside the microprocessors. The invention is also designed for reducing run-length of the instructions found between branch instructions by disassembling the instructions in a basic block as a BLA instruction and a single or plurality of non-BLA instructions from the software/assembly program. The invention is also designed for dynamically reassembling the BLA and the non-BLA instructions and delivering them to a single or plurality of microprocessors in a compatible sequence. In particular, the reassembled instructions are concurrently delivered to a single or plurality of microprocessors in a timely and precise manner while providing compatibility of the software/assembly program.

18 Claims, 3 Drawing Sheets

(51) Int. Cl.
*H03K 3/356* (2006.01)
*G06F 9/32* (2018.01)
*G06F 9/30* (2018.01)

(52) U.S. Cl.
CPC ..... *G06F 9/3818* (2013.01); *H03K 3/356182* (2013.01); *H03K 17/687* (2013.01)

(56) References Cited

U.S. PATENT DOCUMENTS

| | | | | |
|---|---|---|---|---|
| 6,047,368 A * | 4/2000 | Arya | ................... | G06F 9/30174 |
| | | | | 712/214 |
| 6,167,536 A * | 12/2000 | Mann | ................... | G06F 11/3419 |
| | | | | 714/45 |
| 7,181,597 B2 * | 2/2007 | Miller | ................... | G06F 9/3808 |
| | | | | 711/118 |
| 7,269,715 B2 * | 9/2007 | Le | ........................ | G06F 9/3802 |
| | | | | 712/215 |
| 7,441,110 B1 * | 10/2008 | Puzak | ................... | G06F 8/4442 |
| | | | | 712/207 |
| 9,489,205 B1 * | 11/2016 | Jung | ....................... | G06F 8/443 |
| 9,519,586 B2 * | 12/2016 | Gilbert | ................... | G06F 9/383 |
| 10,078,514 B2 * | 9/2018 | Eickemeyer | .......... | G06F 9/3802 |
| 10,223,090 B2 * | 3/2019 | Jung | ................... | G06F 12/0875 |
| 10,379,857 B2 * | 8/2019 | Eickemeyer | ........ | H04L 45/7457 |
| 2014/0208039 A1 * | 7/2014 | Gilbert | ................... | G06F 9/3832 |
| | | | | 711/137 |
| 2016/0283243 A1 * | 9/2016 | Jung | ................ | H03K 3/356182 |
| 2017/0115988 A1 * | 4/2017 | Jung | ....................... | G06F 8/4441 |
| 2017/0329608 A1 * | 11/2017 | Eickemeyer | ........ | G06F 12/0862 |
| 2018/0365012 A1 * | 12/2018 | Eickemeyer | ........ | G06F 12/0897 |

OTHER PUBLICATIONS

'Using a Lookahead Window in a Compaction-Based Parallelizing Compiler' by Toshio Nakatani et al., copyright 1990. (Year: 1990).*

* cited by examiner

B-1 SINGLE NON-SCALED BIQ FOR SINGLE BI FETCH

| BI-1 | BI-2 | BI-3 | BI-4 | BI-5 | BI-2 | BI-6 | BI-7 |
|------|------|------|------|------|------|------|------|
| 10   | 11   | 12   | 13   | 14   | 11   | 15   | 16   |

B-2 DUAL NON-SCALED BIQS FOR DUAL BI FETCH

| BI-1 | BI-3 | BI-5 | BI-6 |
|------|------|------|------|
| BI-2 | BI-4 | BI-2 | BI-7 |

10, 12, 14, 15 (top row) / 11, 13, 11, 16 (bottom row)

B-3 SINGLE NON-BIQ FOR SINGLE NON-SCALED NON-BI FETCH

| NON-BI-1 | NON-BI-2 | NON-BI-3 | NON-BI-4 | NON-BI-5 | NON-BI-2 | NON-BI-6 | NON-BI-7 |
|----------|----------|----------|----------|----------|----------|----------|----------|
| 20       | 21       | 22       | 23       | 24       | 21       | 25       | 26       |

B-4 SINGLE NIQ FOR SINGLE NON-SCALED NATIVE INSTRUCTION FETCH

| NI-1-1 : NI-1-S | NI-2-1 : NI-2-Z1 | NI-3-1 : NI-3-U1 | NI-4-1 : NI-4-V |
|---|---|---|---|
| 100 | 101 | 102 | 103 |

| NI-5-1 : NI-5-W1 | NI-2-1 : NI-2-Z1 | NI-6-1 : NI-6-X1 | NI-7-1 : NI-7-Y1 |
|---|---|---|---|
| 104 | 101 | 105 | 106 |

B-5 DUAL NIQS FOR DUAL NON-SCALED NATIVE INSTRUCTION FETCH 100, 102, 104, 105

| NI-1-1 : NI-1-S | NI-3-1 : NI-3-U1 | NI-5-1 : NI-5-W1 | NI-6-1 : NI-6-X1 |
|---|---|---|---|
| NI-2-1 : NI-2-Z1 | NI-4-1 : NI-4-V | NI-2-1 : NI-2-Z1 | NI-7-1 : NI-7-Y1 |

101, 103, 101, 106

B-6 DUAL NON-BIQS FOR DUAL SCALED NON-BI FETCH 20, 22, 23-B, 24-B, 25

| NON-BI-1 | NON-BI-3 | NON-BI-4B | NON-BI-5B | NON-BI-6 |
|----------|----------|-----------|-----------|----------|
| NON-BI-2 | NON-BI-4A | NON-BI-5A | NON-BI-2 | NON-BI-7 |

21, 23-A, 24-A, 21, 26

B-7 DUAL NIQS FOR DUAL QUAD-SCALED NATIVE INSTRUCTION FETCH

| NI-1-1 | : | NI-2-1 | : | NI-3-1 | : | NI-4-1 | : |
|---|---|---|---|---|---|---|---|
| NI-1-4 | NI-1-S | NI-2-4 | NI-2-Z1 | NI-3-4 | NI-3-U1 | NI-4-4 | NI-4-V |

100, 101, 102, 103

| NI-5-1 | : | NI-2-1 | : | NI-6-1 | : | NI-7-1 | : |
|---|---|---|---|---|---|---|---|
| NI-5-4 | NI-5-W1 | NI-2-4 | NI-2-Z1 | NI-6-4 | NI-6-X1 | NI-7-4 | NI-7-Y1 |

BRANCH LOOK-AHEAD INSTRUCTION DISASSEMBLING, ASSEMBLING, AND DELIVERING SYSTEM APPARATUS AND METHOD FOR MICROPROCESSOR SYSTEM

TECHNICAL FILED OF THE DISCLOSURE

The invention relates to creating branch look-ahead (BLA) instructions from a software program and to prefetching and fetching the BLA instructions (BIs) along with the non-BLA instructions (non-BIs) in the program in compatible sequence.

The invention relates to the conversion of the program in prior arts to the branch prediction friendly compatible program that allows a single or plurality of microprocessors to improve speed of branch prediction process. In particular, the invention relates to composing the BIs to removing a single or plurality of non-branch instructions between any branch instructions and any instructions at the branch target locations. Furthermore, the invention relates to composing the BIs to allocating non-BIs by the associated BIs to the program memories and caches.

The invention relates to prefetching and fetching a single or plurality of BIs and non-BIs from a single or plurality of main memories to the single or plurality of microprocessors in a timely and precise manner via a single or plurality of instruction cache memories if necessary. The invention also relates to the reduction of the bubbles on the pipeline installed in the single or plurality of microprocessors.

The invention relates to updating a single or plurality of values to a single or plurality of BI program counters installed in the single or plurality of microprocessors for accessing the BIs and to transmitting the values of the BI program counters to the invented BI prefetch/fetch system.

The invention relates to the initiation and termination of access to the BIs and non-BIs, sequentially and/or concurrently placing the BIs and/or non-BIs to the single or plurality of instruction caches, and delivering compatible or executable instructions to the single or plurality of microprocessors.

The invention relates to the software security used for preventing malicious and illegal copying of software programs.

BACKGROUND OF THE DISCOLOSURE

The present invention relates generally to static BI disassembling and dynamic BI/non-BI assembling and delivering, and more specifically, it relates to a branch look-ahead instruction assembling, prefetching and fetching system apparatus and method to reduce the amount of clock cycles for predicting next branch target locations. The invention also relates to identify the BIs and non-BIs. More specifically, a BI represents a single or plurality of associated non-BIs and/or other BIs and contains information to predicting branch operation and obtaining branch target location of the BI.

The BI assembling and delivering system apparatus and method is designed for enhancing access time of both of the BIs and non-BIs, resolving or lightening the penalty of instruction cache misses, and improving the overall performance of the microprocessor system. The invented system uses an instruction prefetching and fetching system integrated to a single or plurality of concurrently accessible hierarchical memory systems.

The invented BI assembling and delivering system prefetches and/or fetches a single or plurality of BIs concurrently while delivering a single or plurality of non-BIs to the single or plurality of microprocessors in their fetching and decoding order. The BI assembling and delivering system distinguishes the prefetched and fetched BIs and the associated non-BIs from the single or plurality of main instruction memories via a single or plurality of levels of instruction caches before delivering the BIs and non-BIs to the microprocessors.

The invented BI assembling and delivering system is capable of prefetching the single or plurality of non-BIs from the associative locations of the main instruction memories via the single or plurality of levels of instruction caches by passing a single or plurality of addresses of the BIs to a single or plurality of locations in the main memories and/or caches accordingly. The invention prefetches the next prospective BIs while delivering both of the BIs and non-BIs to the microprocessors.

In order to represent a single or plurality of non-BIs, the invention generally assembles basic blocks, which are segments of instructions between two instructions that are branch and branch target instructions and vice versa. The branch instructions, such as both conditional and unconditional branches, provide their branch target locations if possible. A non-deterministic branch target location that cannot be obtained at the compilation time can be obtained after program executions.

In addition, a branch target location of a BI can be obtained from the associated branch target buffer or similar component for prefetching/fetching the next BI if necessary. The same branch target location of the BI can be obtained from the single or plurality of microprocessors for prefetching and/or fetching the next BI if necessary. A branch target instruction can be any BI at a branch target location. The BI represents a basic block as a single instruction if necessary. In particular, a BI contains a single or plurality of non-BIs and/or other BIs in a single instruction form as a BI composed at the BI disassembling time. A BI consists of the branch instructions with non-branch instructions, all of the instructions in a loop or a subroutine, or all of the non-branch or branch target instructions. A BI is comprised of a single or plurality of non-BIs and/or other BIs.

Two types of instructions are obtained from the software compiled program, such as the assembly program, after the BLA disassembling. The first type of instruction contains BIs. The second type of instruction contains non-BIs, which can be the same as the instructions before the BLA disassembling. Alternatively, this static BI disassembling can be integrated to the software compilers.

The BIs and non-BIs are concurrently prefetched and/or fetched through separate paths of the invented memory system if necessary. Therefore, the BIs call a single or plurality of non-BIs. The non-BIs are bodies of the basic blocks in general. These bodies of the basic blocks are only fetched after prefetching both the basic block callers, such as the BIs and bodies of the basic blocks, such as the non-BIs and/or other BIs. This results in the smoother BLA and non-BLA assembling between the high-level programming style comprising of a main program including a plurality of basic block callers and the associated basic blocks and the assembly programming style in prior arts.

A non-BI is a native instruction (NI) of the target microprocessor. A non-BI is a NI that is disassembled from any other NI and/or BI. On the other hand, a BI represents the NIs appearing in the associated basic block or a segment of the consecutive NIs.

The BIs are composed by disassembling segments and/or all of NIs in basic blocks including loops and subroutines, and parts of the NIs in any sequential parts of the program, and by assigning segments of the NIs to individual BIs. A sequential part of the program must contain a single or plurality of NIs including only non-branch and non-branch target instructions. The BIs contain associated opcodes and/or other information, such as start and/or end locations of the NI segments of the BIs, the number of instructions assembled in each BI, the information of the branch target locations, and so on, for the BI prefetching and fetching system to decode BIs as well as to identify the native branch instructions.

The BI assembling and delivering system apparatus and method for microprocessor system distinguishes BIs for concurrently accessing a single or plurality of non-BIs from the dedicated, separate regions of distinct addresses in instruction caches and/or main memories if necessary.

The BI assembling and delivering system apparatus and method for microprocessor system permits reducing the number of branch instruction appearances, and provides the same instruction prefetching/fetching capability of the NIs. In addition, the BI assembling and delivering system apparatus and method for microprocessor system allows the usage of different sizes of instruction cache by scaling BIs to achieve functional compatibility and performance enhancements by delivering a plurality of BIs during the same cycles. Therefore, the BI assembling and delivering system apparatus and method for microprocessor system handles the branch and non-branch instructions disassembled from the original NI segments in the program to the BIs and non-BIs. Alternatively, the invention directly generates the BIs and non-BIs from software written in high-level programming language.

The BI assembling and delivering system apparatus and method for microprocessor system effectively utilizes available instruction caches in terms of the cache size, power consumption, and operational speed. In addition, the invention permits considerably conserving instruction cache size or simplifying the cache organization from the hierarchical instruction memory system. The invention also prefetches the BIs on the prospective locations in the program flow concurrently for enhancing cache hit rate. Furthermore, the invention prevents the instruction caches from wasting energy by accurately prefetching and fetching the BIs and non-BIs that are highly used once they have been accessed and stored in the instruction caches. Since more operations, including branches, subroutine callers, and subroutine returners, are reduced and/or disassembled into BIs, which are stored in and accessed from small, simple, and low-power caches, such as direct mapped caches, the invention is useful for low-power and performance-aware microprocessors.

Through this invention, developers can compose their own compatible and ciphered instructions and prefetch and fetch compatible instructions concurrently from the main memories via the levels of caches. More specifically, a single or plurality of branch prediction results is available for prefetching and/or fetching next segment of the NIs to the microprocessors.

PROBLEMS OF THE ART

Demands for high-performance and energy-efficient mobile processors continue to grow over those for mobile smart devices that place more weight on energy efficiency. In particular, smartphones are necessary to handle two different characteristics of applications: bursting high-performance applications, including gaming and video related applications, and consistent low-power operations of mobile OS and related applications. In general, current mobile processors permit a trade-off between having energy efficiency and high-performance in mobile SoC processors. Therefore, mobile SoC architects and developers have been unceasingly exploring and introducing revolutionary designs to the mobile smart device manufacturing industry.

In particular, faster, larger, and special caches and/or hardware or software prefetch/fetch mechanisms have been applied to high-performance mobile microprocessors in attempts to overcome such limitations and inefficiencies between processors and memory systems. For instance, internal loop caches and trace caches have proved their ability to improve performance. The compilers also had simple/advanced software prefetching algorithms.

U.S. Pat. No. 7,181,597 [1] provides enhanced performance by employing a trace cache. In particular, this approach decodes the first instruction into a single or plurality of operations with a decoder. The decoder passes the first copy of the operations to a build engine associated with a trace cache. In addition, the decoder directly passes the second copy of the operation to a back end allocation module in a decoder. This approach enhances performance by selectively bypassing a trace cache build engine.

A trace cache [2] is presented that contains decoding information of the instructions consecutively executed before. To achieve higher throughput from superscalar processors, fetching multiple basic blocks per cycle becomes necessary. The trace cache supplements instruction cache by dynamically tracing the instruction stream and contiguously locating the instructions. The trace cache directly passes the decoding information when the same instruction stream is decoded. Consequently, performance enhancement and high bandwidth instruction fetching can be achieved with the trace cache. However, this approach heavily relies on the capability of employing branch prediction hardware for performance improvement. The trace cache approach must obtain decoding results after dynamically decoding the same instructions. The trace cache approach cannot hold all of the traces of the multiple blocks without increasing the trace cache size. Furthermore, this approach must decode again and keep the trace of the decoded results of the instruction block if the trace of the same block is changed.

U.S. Pat. No. 6,167,536 [3] presents an on-chip instruction trace cache capable of providing information for reconstructing instruction execution flow. In particular, U.S. Pat. No. 6,167,536 [3] presents the instructions that disrupt the instruction flow by branches, subroutines, and data dependencies. Therefore, this approach allows less expensive external capture hardware to be utilized and also alleviates various bandwidth and clock synchronization issues confronting many existing solutions.

Microprocessors have evolved to mitigate the memory bandwidth problems. Pipelined architectures, including superscalar and very-long instruction word (VLIW), increase the difficulty of handling such flow control issues by paying fewer penalties while simultaneously processing multiple instructions in the pipeline. In order to reduce these flow control penalties, microprocessors need to know the direction and target address of the next instruction so that software (e.g., compiler) designers can foresee the flow of instruction streams before runtime. Thus, designers continuously develop branch prediction techniques [4, 5] and fetch engines [6] to address the ongoing penalty problem.

A dynamic code optimization approach [7] employs code generation at load-time and continuous source-code optimization at runtime for optimally matching software with hardware while improving instruction-level parallelism. To provide sufficient visibility in instruction fetch, a block-aware instruction-set architecture [8] was introduced to facilitate flow control prediction. Basic block descriptors provide the types of flow control operations. These block descriptors not only eliminate instruction-cache latency from the critical path of accurate prediction but also offer a flexible mechanism for further improvements in program code density, power reduction, and hardware complexity.

In contrast to prior arts, the invention significantly break through the bottleneck between instruction memories and caches and microprocessors and the inefficiency between the high fraction of the compiled codes and the instruction fetch schemes installed in microprocessors.

U.S. Pat. No. 6,047,368 [9] claims that an instruction packing apparatus employs a compatibility circuit including translation and grouper circuits where the translation and grouper circuits, respectively, transform old instructions to new instructions as simpler forms and group instructions based on instruction type by hardware when transferring a cache line from the memory to cache. Although the dynamical packing and identifying of assigned functionalities of the assembled instructions issue and execute concurrently, this approach focuses only on increasing instruction level parallelism while paying additional hardware cost. U.S. Pat. No. 6,047,368 [9] still requires at least the same or more instruction cache.

U.S. Pat. No. 5,509,130 [10] describes packing and issuing instructions simultaneously per clock cycle for execution. An instruction queue stores sequential instructions of a program and branch target instruction(s) of the program, both of which are fetched from the instruction cache. The instruction control unit decodes the sequential instructions, detects operands cascading from instruction to instruction, and groups instructions according to a number of exclusion rules which reflect the resource characteristics and the processor structure. This approach, however, groups instructions after fetching sequential instructions from the instruction cache. Therefore, it still requires involving branch prediction and resolution units for branch instructions because of packing at runtime.

U.S. Pat. No. 7,269,715 [11] presents an improved method and apparatus for packing instructions processed in the same sized instruction sets. This approach distinguishes a current set of instructions received as part of a group including a prior set of instructions using a history data structure. The assembled or reformatted non-native instructions with a packing indication are issued to the execution units. This approach requires additional hardware, such as grouper circuit and translation circuit.

One of the viable approaches to improving the performance of a microprocessor is increasing the concurrent and speculative execution of multiple instructions. This high instruction level parallelism can be achieved by eliminating or reducing data and/or control flow constraints, which cause bubbles on the pipelines. In contrast, unpredictable branch instructions cause control flow problems. Removing control flow problems permits formatting larger blocks of instructions to achieve higher instruction level parallelism. Speculative execution and software pipelining have been used for this purpose.

Caches are faster than the main memory and consume less power per access than does the main memory. As the number of transistors on the chip increases, the cache size also increases. On-chip caches present a major contribution to the transistor budget. For instance, approximately 90% of the transistors are dedicated to cache structures in the Itanium 2 processor chips [12].

In addition, more and more features have been added to caches in order to squeeze out additional power saving. A direct mapped cache, which has a simplified structure, has a much lower per access energy consumption (i.e., about 40%) than the same sized set associative cache [15]. However, a direct mapped cache has faster access time because it does not have a multiplexor that is employed by a set associative cache. Unfortunately, the direct mapped cache has lower hit rates than the same sized set associative one. This results in more memory access causing both energy and time costs.

Multimedia applications have a few small loops that are executed a large number of times compared with other applications in SPEC-2000 [13]. Regardless of applications, conditional branches represent a significant fraction of total instructions executed in a program. In details, researchers also found 16 or fewer instructions in 75% of the loops in the MediaBench and 30 or fewer instructions in 95% and 90% of the loops in the MediaBench and SPEC-2000, respectively [14]. Therefore, the key features of software fetched via instruction cache are the many short distance branches and frequently used branch instructions (i.e., a branch instruction is discovered after every seven instructions).

The invention deals with both scaled and non-scaled BIs that include loops and/or subroutines with branch instructions and disassembles them to a single BI and the associated non-BIs. Branch prediction, therefore, is not necessary for those branch instructions already disassembled to a BI, but executes correct branch operations including the operations of the entire loop/subroutine enclosed.

Since a BI in the invention is dynamically reassembled to identical or shortened basic block or the number of consecutive non-branch instructions as non-BIs during the instruction assembling and prefetch/fetch operations, the microprocessor continues to execute the reassembled instructions as non-BIs while a fetched BI is used for predicting branch and forwarding a branch target address for prefetching/fetching the next instruction by updating the associated BI program counter installed in the BI prefetching/fetching system.

The invention also prefetches and/or fetches BIs within fewer cycles than the conventional microprocessors do with the instructions generated by the conventional compilers. It is true that the amount of basic blocks are less than equal to the amount of NIs in the same basic blocks. For instance, two microprocessors need to predict branches in forty NIs in ten basic blocks. The first microprocessor along with the invention fetches ten BIs about four times quicker than the second microprocessor fetches forty instructions. Thus, the invention permits that the branch prediction operations can be started approximately four times earlier than the same operations executed by the second microprocessor, which fetches forty instructions.

In addition, the invention allows all non-BIs of the associated BIs to concurrently fetch if necessary. The invention temporarily holds its next fetch operation until the BI representing a conditional branch instruction is predicted. This prevents unwanted instructions from being fetched to the microprocessor. Alternatively, a branch predictor shared with a microprocessor and the invented system permits to predict the branch independently so that the invention can execute the next fetch operation without waiting for the branch prediction result from the microprocessor.

Furthermore, the invention discards the BIs representing sub-callers/returns and unconditional branches while fetches only instructions in bodies of the subroutines if necessary. Aforementioned features allow the invention to fetch NIs in a timely and precise manner.

Since each BI (e.g., a loop or a subroutine) generally contains one or more than one NI, the disassembled single or plurality of non-BIs is prefetched in concurrent manners. Therefore, multi-cycle instruction cache or even longer main memory access time can be compensated by prefetching early an ample number of NIs as a single BI concurrently and fetching the prefetched instructions in the program order.

In addition, the number of instructions disassembled into each BI from NIs in the program is scaled in order to balance the instruction cache usage by addressing the non-BIs of the consecutively located BIs to the dedicated, separate regions in instruction caches and/or main memories, such as cache/memory banks, dual or multiple ports memories, and so on. Consequently, the balanced instruction cache usage in the invention reduces unused or frequently replaced cache lines according to the associated cache replacement policy. The invention is useful for parallel instruction prefetch from the main memory to the upper-level cache (i.e., L2 cache) and pipelined instruction prefetch from the upper-level cache to the lower-level cache (i.e., L1 cache) according to the tradeoff between access per power consumption and the number of concurrently fetched and/or prefetched instructions for microprocessor performance.

SUMMARY OF THE DISCLOSURE

The invention generally relates to a microprocessor system consisting of a software compiler as a static BI disassembling system and a dynamic BI/non-BI assembling and delivering system consisting of an instruction prefetching and fetching system, an instruction cache and memory system, and a branch look-ahead system in the microprocessor.

The static BI disassembling system is for disassembling NIs in software and/or assembly program, to BIs and non-BIs during the instruction disassembling time. The dynamic BI/non-BI assembling and delivering system is for reassembling the BIs to non-BIs stored in the dedicated, separate regions of distinct addresses in instruction caches and/or main memories during the BI/non-BI prefetching and/or fetching time. In addition, the delivered BIs to a branch look-ahead system for improving speed of branch prediction process and finally for enhancing performance of the microprocessor system by reducing the amount of clock cycles required to deliver branch instructions for being predicted.

The static BI disassembling system is for separating NIs in the software/assembly program to BIs and non-BIs during the instruction disassembling time. After disassembling, two types of instruction are obtained. The first type of instruction includes BIs, which reflects the program execution order in the program. The second type of instruction only includes non-BIs of the associated BIs. These two types of instruction are stored in dedicated, separate regions of distinct addresses in the single or plurality of instruction memories. Alternatively, the static BI disassembling system may directly generate the BIs and non-BIs from software written in high-level programming language.

In order to reduce flow control instructions including subroutine callers and returners, unconditional and conditional branches, the static BI disassembling system disassembles basic blocks, which are segments of NIs between two instructions that are branch and branch target instructions or vice versa. In addition, the static BI disassembling system scales and disassembles the basic blocks and the instruction segments for various sizes of caches in the dynamic BI/non-BI assembling and delivering system.

The static BI disassembling system is also designed for improving performance of microprocessors by reducing branch instructions from the non-BIs. More specifically, the branch instruction in a loop is disassembled, so that the BI representing a loop can avoid to be fetched the same BI to the microprocessor until all of the required iterations of the loop are completed. Similarly, the microprocessor does not need to execute a pair of branch operations for the subroutines because branch instructions of subroutines, such as subroutine callers and returners, are removed from the associated non-BIs. Therefore, any unconditional branch instructions in the BI/non-BI program are not necessary to fetch to the microprocessor unlike what is done in prior arts.

In addition, the static BI disassembling system is to properly allocate the non-BIs to the dedicated, separate regions of distinct addresses in the single or plurality of main instruction memories. More specifically, the non-BIs located right after a branch instruction in the program must not be stored to the same region of addresses where the non-BIs are located at the branch target location of the branch instruction.

The dynamic BI/non-BI assembling and delivering system consists of a BI/non-BI memory system, a BI/non-BI prefetch/fetch system, a branch look-ahead system, and a backend microprocessor. In particular, the BI/non-BI memory system consists of a single or plurality of main BI/non-BI memories and a single or plurality of levels of the BI/non-BI caches in hierarchy. The BI/non-BI prefetching and fetching system is for prefetching and fetching BIs/non-BIs from dedicated, separate regions of distinct addresses in a single or plurality of instruction caches and main memories.

The BIs/non-BIs are dynamically assembled during the BI/non-BI prefetching and/or fetching time. The assembled instructions of the BIs are the associated non-BIs and/or NIs that can be executable to the target microprocessor. More specifically, both the subroutine call instruction as a BI and the subroutine return instruction in the associative subroutine are removed during the dynamic BI/non-BI assembling.

The single or plurality of main BI/non-BI memories and BI/non-BI caches in a hierarch is to hold and deliver the BIs and non-BIs concurrently and precisely via a single or plurality of reduced size and simplified structured caches. More specifically, a single or plurality of BIs are prefetched and/or fetched in parallel for increasing the number of the BIs prefetched and/or fetched per clock cycle or for further increasing the BIs prefetching and/or fetching per cycle by composing smaller size of BIs and delivering on the same BI memory system. For instance, reducing by two times of the BIs results in twice more BIs can be prefetched and/or fetched per cycle.

There has thus been outlined, rather broadly, some of the features of the invention in order that the detailed description thereof may be better understood, and that the present contribution to the art may be better appreciated. Additional features of the invention will be described hereinafter.

In this respect, before explaining at least one embodiment of the invention in detail, it is to be understood that the invention is not limited in its application to the details of construction or to the arrangements of the components set forth in the following description or illustrated in the drawings. The invention is capable of other embodiments and of being practiced and carried out in various ways. Also, it is to be understood that the phraseology and terminology employed herein are for the purpose of the description and should not be regarded as limiting.

An object is to provide a BI disassembling, assembling, and delivering system apparatus and method that improves the energy efficiency and performance of the microprocessor system, including the achievement of accurate and/or concurrent prefetching and/or fetching of BIs and non-BIs, for enhanced microprocessor throughput while maintaining compatibility of the software.

An object is to provide a static BI disassembling system that splits the NIs in the software and/or assembly program into BIs and non-BIs. Alternatively, the BIs and non-BIs can also be generated by a single compilation that includes the same NI assembling capability as the invented system. The BIs are composed by assigning different opcodes and other information to the BIs if needed.

Another object is to provide a static BI disassembling system that eliminates and/or hides branch instruction(s) from the original program and composes compatible and customized forms of the BIs for preventing malicious and illegal copying of various software programs while delivering compatible segments of the NIs to the microprocessor.

An object is to provide the dynamic BI/non-BI assembling and delivering system that decodes the BIs for concurrently prefetching and fetching the associated non-BIs stored in dedicated, separate regions of distinct addresses in a single or plurality of instruction caches and main memories.

Another object is to provide the dynamic BI/non-BI assembling and delivering system that dynamically assembles the BIs to the associated non-BIs and/or NIs during the BI prefetching and/or fetching operations.

Another object is to provide the dynamic BI/non-BI assembling and delivering system that prefetches a single or plurality of BIs from the next prospective locations, such as the next BI at the branch target location, whenever prefetching and/or fetching a BI.

Another object is to provide the dynamic BI/non-BI assembling and delivering system apparatus and method that provides a way to satisfy the desired effective cache usage and performance enhancement by reducing branch prediction and cache miss penalties through the invented accurate, concurrent prefetching and fetching system, unlike memory systems employed in microprocessors in prior arts that are incapable of performing to such demands.

Another object is to provide the dynamic BI/non-BI assembling and delivering system apparatus and method that provides a way to shorten branch prediction latency by delivering branch instructions to the branch prediction unit earlier than microprocessors in prior arts can do.

Another object is to provide the dynamic BI/non-BI assembling and delivering system apparatus and method that utilizes BIs, which encapsulate only undisrupted NI segments, in the program to accurately prefetch the single or plurality of non-BIs that will be fetched and executed by the microprocessor, unlike prefetching a certain number of the NIs that include many of the unused instructions for execution of the microprocessor in prior arts.

Other objects and advantages of the present invention will become obvious to the reader and it is intended that these objects and advantages are within the scope of the present invention. To the accomplishment of the above and related objects, this invention may be embodied in the form illustrated in the accompanying drawings, attention being called, however, to the fact that the drawings are illustrative only, and that changes may be made in the specific construction illustrated and described within the scope of this application.

BRIEF DESCRIPTION OF THE DRAWINGS

A more complete understanding of embodiments of the disclosure will be apparent from the detailed description taken in conjunction with the accompanying drawings in which:

FIG. 3 is a diagram showing one embodiment of organizations and operations of a single or plurality of BI queues (BIQs) in the BI fetch unit and a single or plurality of non-BIQs and/or IQs in the non-BI fetch unit and scaling operations of BIs and non-BIs for parallel fetch to a single or plurality of BIQs in the BI fetch unit and non-BIQs and/or IQs in the non-BI fetch unit.

DETAILED DESCRIPTION OF EXAMPLE EMBODIMENTS

Figure 1:
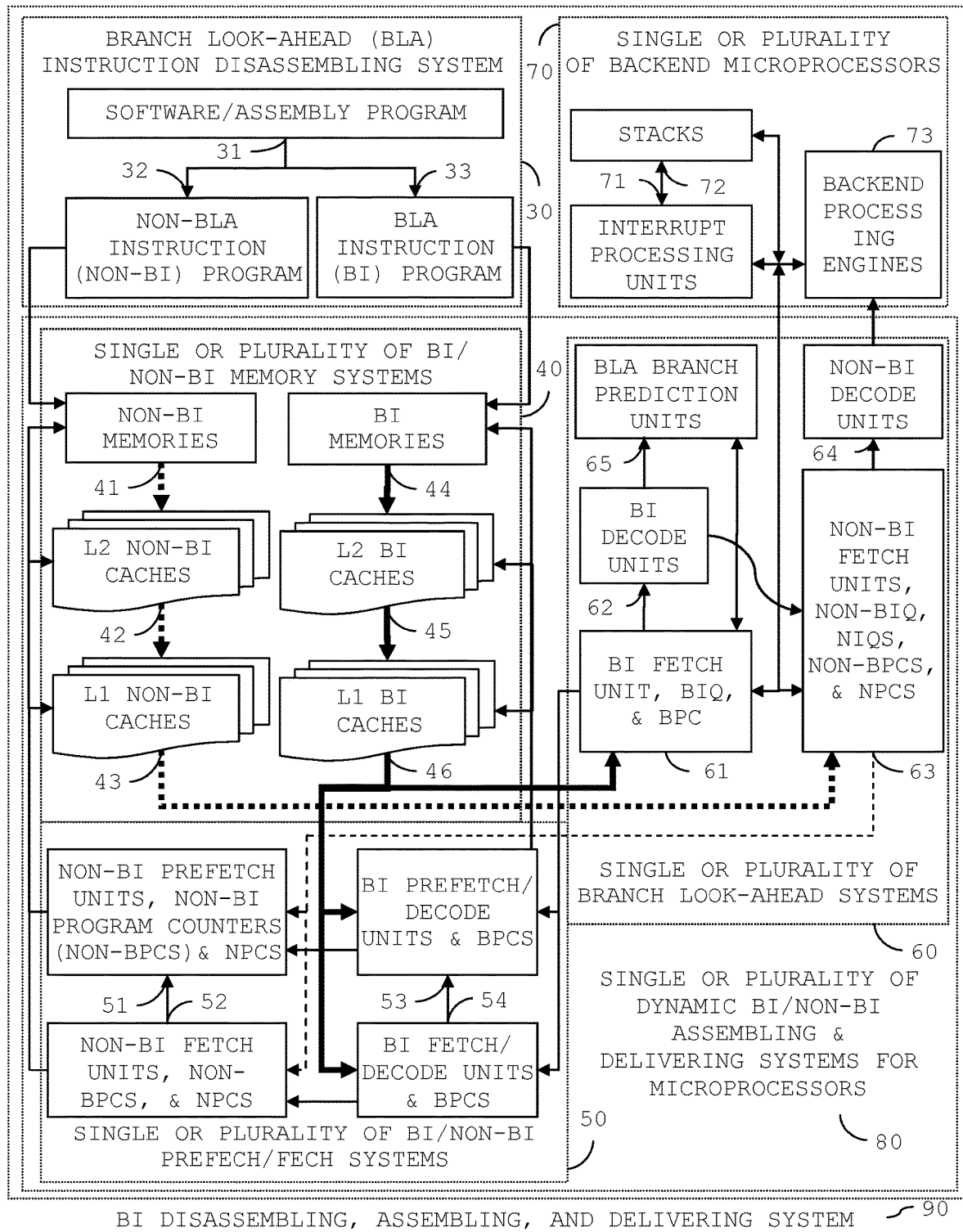
FIG. 1 is a diagram showing one embodiment of a BI disassembling, assembling and delivering system apparatus and method for microprocessor system consisting of a static BI/non-BI disassembling system and a dynamic BI/non-BI assembling and delivering system, which consists of a single or plurality of BI/non-BI memory systems, a single or plurality of BI/non-BI prefetch/fetch systems, a single or plurality of branch look-ahead systems, and a single or plurality of backend microprocessors.

FIG. 1 shows one embodiment of a BI disassembling, assembling, and delivering systems apparatus and method for microprocessor system 90 that consists of a BI/non-BI disassembling system 30 and a single or plurality of dynamic BI/non-BI assembling and delivering systems 80 consisting of a single or plurality of BI/non-BI memory systems 40, a single or plurality of BI/non-BI prefetch/fetch systems 50, a single or plurality of branch look-ahead (BLA) systems 60, and a single or plurality of backend microprocessors 70.

In one embodiment, a BI/non-BI disassembling system 30 disassembles the NIs in a software and/or assembly program 31 to BI program 33 and non-BI program 32 during the static BI disassembling time. The BI/non-BI disassembling system 30 disassembles NIs in program 31 and eliminates unconditional branch instructions. The BIs in the BI program 33 consist of another BIs and non-disassembled NIs, such as conditional branch instructions. A plurality of instruction disassembling methods is for reduction of branch instructions, reduction of branch distances, and accurate BI/non-BI prefetch and fetch via a single or plurality of dynamic BI/non-BI assembling and delivering systems 80.

The BI/non-BI disassembling from the software/assembly program 31 is complete after software compilation in prior arts or during the software compilation integrated with the BI/non-BI disassembling system 30. The BI/non-BI disassembling system 30 generates the BI program 33 and the non-BI program 32 from the output of the software compilation in prior arts, such as assembly code.

Each BI comprises an opcode and an information field containing location information of the first NI of the segment of the BI. In particular, all of the BI can have the same opcode or different opcodes. In order to identify how many NIs are encapsulated in a BI, the BI can have an additional field for this purpose. As an alternative approach, each NI encapsulated in the BI has an associated bit stored in the dedicated main non-BI memory 42 for identification of the last NI in the non-BIs assembled by the BI. The last NI associated in each non-BI must have a different bit value from the bit value of the other NIs assembled in the associated non-BI.

The conditional branch instructions cannot determine their branch operations and/or target branch locations during the static BI disassembling time. If any conditional instructions can obtain their branch target locations without assisted by a branch prediction unit, this conditional branch instruction can be considered as an unconditional branch instruction for the dynamic BI/non-BI assembling and delivering systems 80. Therefore, such conditional branch instructions can also be continuously and swiftly prefetched and fetched.

In one embodiment, a single or plurality of dynamic BI/non-BI assembling and delivering systems 80 assembles the non-BI program 32 stored in the non-BLA memory 41 via the non-BI caches 42, 43 according to the associated BI program stored in the BLA memory 44 and caches 45, 46 after delivering BIs to the BI/non-BI prefetch/fetch systems 50 during the BI assembling and delivering time.

In one embodiment, a precise BI prefetching termination method designed in the BI prefetch/decode unit including a single or plurality of BI program counters (BPCs) 53 is designed for prefetching the BIs addressed by the associated BPCs via the BI/non-BI memory systems 40 and for decoding the prefetched BIs to prefetch the associated non-BIs. The precise BI prefetching termination method shows when prefetching operations must be ended. Current BI prefetching operations will be terminated after prefetching BIs in two different paths in the precise BIs prefetching termination method, when the conditional BI in the program 33 representing any conditional branch instructions requiring branch prediction is detected. The BI prefetched from one path is a BI, which represents a native branch target instruction. The BI prefetched from another path is also a BI located at the next location in the BI program 33. However, a BI represents a native unconditional branch instruction providing their branch target address continue to prefetch the BI from the branch target location of the BI program 33. This unconditional BI is not fetched to the backend microprocessors 70 via the BLA systems 60, but discarded after obtaining its branch target location. In order to obtain branch target addresses, various branch predictors and branch target buffers in prior arts can be used if necessary.

In one embodiment, the BIs in the BI program 33 and non-BIs in the non-BI program 32 are separately allocated to the different locations of the same or different sequential and/or concurrent accessible caches 42, 43, 45, 46 and main memories 41, 44 in the BI/non-BI memory systems 40. The single or plurality of levels of the caches in the sequential and/or concurrent accessible caches and main memories have the same or different sizes of the same or different number of banks that can be concurrently accessed if necessary. Multi-port caches and main memories, such as dual-port RAM can also be used for allocating the BIs in the BI program 33 and non-BIs in the non-BI program 32.

In order to prefetch non-BIs in the non-BI program 32 concurrently, the NIs of the consecutive BIs in the BI program 33 are allocated to the different banks in the sequential and/or concurrent accessible caches 45, 46 and BLA main memories 44. In particular, the non-BI located right after a branch instruction in the program 31 must not be stored to the same bank where the non-BIs are located at the branch target locations of the branch instructions for the concurrent prefetch and/or fetch. The non-BIs are stored to the different banks of the non-BI main instruction memory 41 in the circular manner according to the allocation rules of the NIs reassembled as the non-BI.

The employed single or plurality of levels of the BI/non-BI caches 42, 43, 45, 46 in the sequential and/or concurrent accessible caches and main memories 40 have the same or different sizes of the same or different number of banks that can be concurrently accessed if necessary. Multi-port cache and main memories (i.e., dual-port RAM) can be used for allocating the BIs 33 and non-BIs 32.

In one embodiment, the BIs stored in the BI memory 44 and caches 45, 46 are assembled to non-BIs stored in the non-BI memory 41 and caches 42, 43 and/or non-disassembled NIs found in the BIs stored in the BI memory 44 and caches 45, 46 by the BI/non-BI prefetch and fetch systems 50.

The BIs are stored in the sequential and/or concurrent accessible caches and main memories 44, 45, 46. The BI is prefetched from the location addressed by the program counter in the BI prefetch/decode units 53 whenever the associated BPCs in the BI prefetch/decode units 53 is updated with a single or plurality of new PC values by decoding the prefetched BIs with the BI prefetch/decode units 53 or by receiving the PC values from a single or plurality of BLA systems 60. The new PC values for prefetching BIs are received from the single or plurality of BLA systems 60 whenever a branch target address is obtained via the BLA branch prediction units 65 in the single or plurality of BLA systems 60 or the interrupt processing units 71 in the single or plurality of backend microprocessors 70. The single or plurality of decoded BIs provides new non-BPC values for prefetching the associated non-BIs to the non-BI prefetch units and non-BPCs 51. More specifically, variable-length NIs are prefetched by the PC values stored in the PCs in the non-BI prefetch units 51.

The single or plurality of BIs is fetched from the locations addressed by the program counters in the BI fetch/decode units 54 whenever the associated BPCs in the BI fetch/decode units 54 are updated with new PC values by decoding the fetched BIs with the BI fetch/decode units 54 or by receiving the PC values from a single or plurality of BLA systems 60. The new PC values for fetching BIs are received from the single or plurality of BLA systems 60 whenever a single or plurality of branch target addresses is obtained via the BLA branch prediction units 65 in the single or plurality of BLA systems 60 or the interrupt processing units 71 in the single or plurality of backend microprocessors 70. The decoded BIs provide a single or plurality of new non-BPC values for fetching the associated non-BIs to the non-BI fetch units and non-BPCs 52. More specifically, variable-length NIs are fetched by the PC values stored in the PCs in the non-BI fetch units 52.

A single or plurality of non-BIs includes the NIs and associated information of the BIs. The non-BIs are stored in the sequential and/or concurrent accessible caches and main memories 41, 42, 43. The non-BIs are prefetched from the locations addressed by the program counters in the non-BI prefetch units 51 whenever the associated BIs are prefetched by the BI prefetch units 53. Alternatively, non-BPCs only address the initial locations of the NIs in the non-BIs. The other NIs consecutively located in the same non-BI are prefetched until the termination values of the last NIs of the non-BIs are prefetched. Then, the non-BPCs are updated to the next non-BIs. More specifically, variable-length NIs are prefetched by the PC values stored in the PCs in the non-BI prefetch units 51.

The non-BIs are fetched from the locations addressed by the program counters in the non-BI fetch units 52 whenever the associated BIs are fetched by the BI fetch units 54. Alternatively, a single or plurality of non-BPCs only addresses the initial locations of the NIs in the non-BIs. The other NIs consecutively located in the same non-BIs are fetched until the termination values of the last NIs of the non-BIs are fetched. Then, the single or plurality of non-BPCs is updated to the next non-BIs. More specifically, variable-length NIs are fetched by the PC values stored in the PCs in the non-BI fetch units 52.

In one embodiment, a single or plurality of BLA systems 60 consists of a single or plurality of BI fetch units 61 and a single or plurality of BI decode units 62, a single or plurality of non-BI fetch units 63 and a single or plurality of non-BI decode units 64, and a single or plurality of BLA branch prediction units 65. The BI fetch units 61 consist of a single or plurality of BPCs and BIQs. The non-BI fetch units 63 consist of a single or plurality of NI queues (NIQs), a single or plurality of native instruction program counters (NPCs), a single or plurality of non-BIQs, and a single or plurality of non-BPCs for operating non-BI fetch before decoding a single or plurality of non-BIs and/or NIs and for transmitting the decode results to the backend processing engines 73 in the single or plurality of backend microprocessors. The BLA branch prediction units 65 can be designed as the branch predictors found in prior arts.

The BIs fetched from the BI/non-BI memory systems 40 via the BI/non-BI prefetch/fetch systems 50 are stored in the BIQs in the BI fetch units 61 if necessary. The BPCs in the BI fetch units 61 are updated to the next BI addresses if the current BIs do not represent any branch instructions fetched. Otherwise, the BPCs must be updated addresses of the BIs at the branch target locations. In case of utilizing of the BIQs for the fetched BIs, various BIQ organizations and operations are described in FIG. 3.

The fetched BIs in the BIQs or directly forwarded from the BI fetch units 61 are decoded by the BI decode units 62, which screen any BIs required to be predicted their branch operations and branch target locations and forward the information for branch prediction to the BLA branch prediction units 65. The BLA branch prediction units 65 can be designed as various branch predictors found in prior arts.

The branch prediction with BIs can be initiated a plurality of clock cycles ahead comparing with the branch prediction with the NIs fetched and decoded in the non-BI fetch units 63 and the non-BI decode units 64. Branch prediction results are available a plurality of clock cycles ahead to initiate the next BI and non-BI prefetch and fetch operations. Consequently, performance of the microprocessors is enhanced by reducing taken-branch latencies.

More specifically, a BI representing a loop is filtered by the BI decode unit 62 and holds further BI fetch in the BI fetch unit 61 while reissuing the same BI representing the same loop to the BLA branch prediction unit 65. This substantially eliminates recursive BI and non-BI prefetching and fetching operations from the BI/non-BI memory systems 40 to the single or plurality of BLA systems 60 via the BI/non-BI prefetch/fetch systems 50.

The BI decode units 62 also decode the BIs to redirect the associated non-BIs fetched to the non-BIQs in the non-BI fetch units 63 if the fetched non-BIs in the non-BIQs 63 are changed. For instance, interrupts are detected and processed by the interrupt processing units 71, which disrupt both of the BI and non-BI fetch, decode, and execution orders. The interrupt processing units 71 in the backend microprocessors 70 need to push both of the current BPCs 61 and non-BPCs and/or NPCs 63 to the stack 72 in order to resume the interrupted BI, non-BI, and NI operations. The interrupt processing units 71 also update new PC values to the BPCs in the BI fetch units 61 and non-BPCs and/or NPCs in the non-BI fetch units 63, respectively. Then, BIs, non-BIs, and NIs of a single or plurality of interrupt service routines is prefetched and fetched to the BI fetch units 61 and non-BI fetch units 63. After the interrupt service routines are completed, the values of the BPCs, non-BPCs, and/or NPCs stored in the stack 72 are retrieved to the BPCs 61, non-BPCs and/or NPCs in the non-BI fetch units 63. The other interrupt-related operations between the interrupt processing units 71 and the backend processing engines 73 are found in prior arts.

Unlike the values of the BPCs 61 are updated, values of the non-BPCs and/or NPCs 63 are reset whenever the last NIs of the associated non-BIs are fetched. The values of the non-BPCs and/or NPCs 63 are increased whenever non-BIs and/or NIs of the next non-BIs are fetched. Alternatively, values of the non-BPCs and/or NPCs 63 are reset whenever the first NIs of the associated non-BIs are fetched. The values of the non-BPCs and/or NPCs 63 are increased whenever non-BIs and/or NIs of the same non-BIs are fetched. This procedure is continued until the next non-BIs and/or the last NIs of the non-BIs are fetched.

A single or plurality of backend microprocessors 70 typically includes datapaths in prior arts. The backend microprocessors 70 include a single or plurality of processing engines 73 including stages of instruction issue, execution, data access, and result write-back on the pipeline. A single or plurality of interrupt processing units 71 and a single or plurality of stacks 72 are also found in prior arts.

Figure 2:
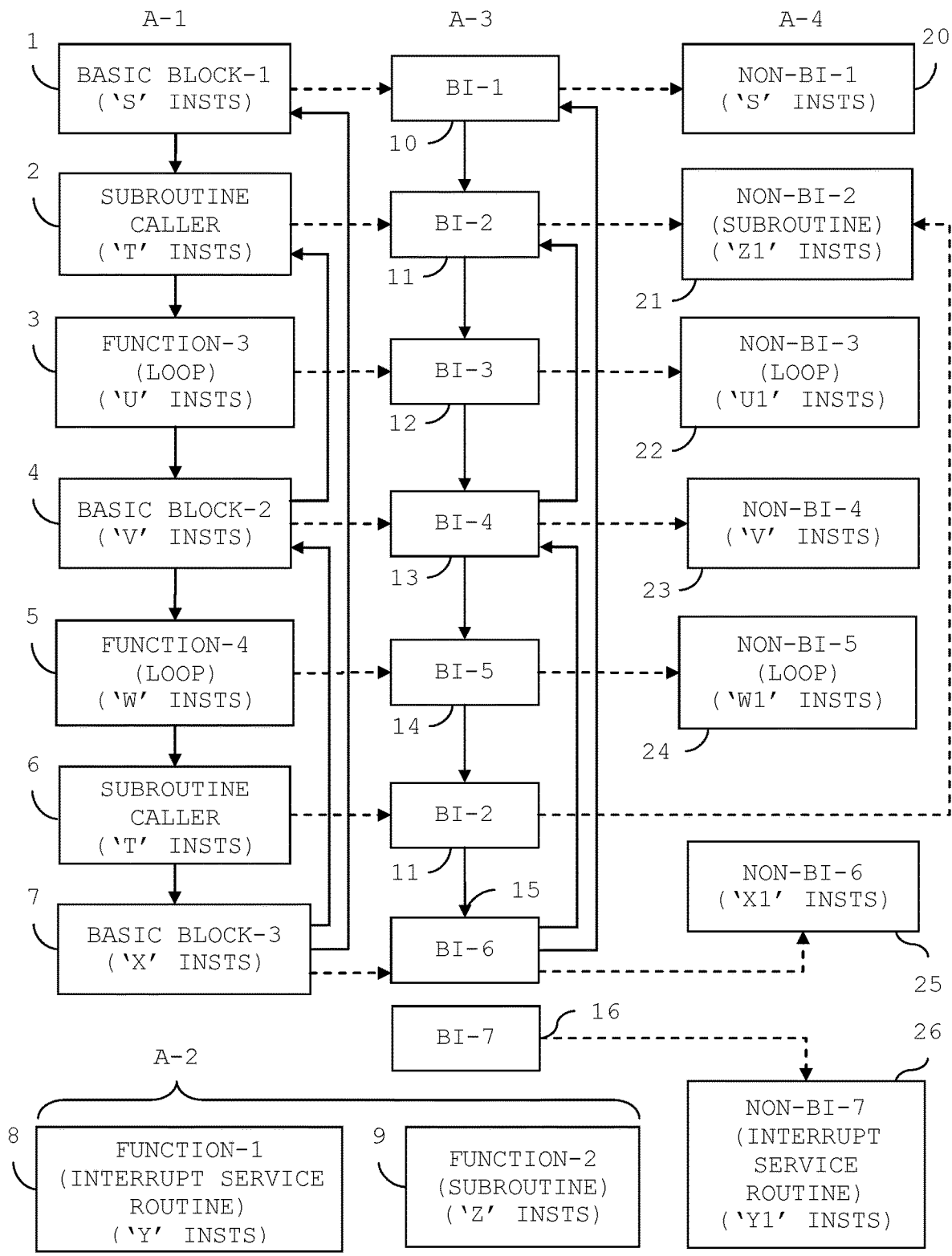
FIG. 2 is a diagram showing one embodiment of a BI/non-BI disassembling system for creating the BIs and separating the non-BIs from the associated BIs according to the instruction segments found in software and/or assembly program.

FIG. 2 is a diagram showing one embodiment of a BI disassembling method and a branch look-ahead operation with the BIs.

In one embodiment, an example of the software/assembly program 31 is shown as A-1, which includes three basic blocks, two subroutine callers, two loop functions. Three basic blocks are: the basic block-1 1 contains 'S' instructions; the basic block-2 4 contains 'V' instructions; and the basic block-3 7 contains 'X' instructions. Two subroutine callers 2, 6 call the function-2 9, which containing 'Z' instructions as a subroutine. Each of the subroutine callers 2, 6 containing 'T' instructions can be a single instruction as seen in prior arts. Two loop functions are: the function-3 3 contains 'U' instructions and the function-4 5 contains 'W' instructions. The 'S', 'T', 'U', 'V', 'W', 'X', 'Y', and 'Z' are positive numbers, which are greater than equal to one.

The seven instruction segments from 1 to 7 in A-1 are fetched and executed in the order shown by the solid line arrows. 'S' NIs in the basic block-1 1 are fetched and executed in program order and followed by the subroutine caller 2, which calls 'Z' NIs in the function-2 9. Two branch instructions, such as a subroutine caller and returner, are fetched and executed. The function-3 3 fetches and executes 'U' NIs as a loop. 'N' times of 'U' instructions are fetched and executed. Then, 'V' NIs in the basic block-2 4 are fetched and executed. The last NI in the basic block-2 4 is a conditional branch instruction, which is predicted 'M' times to take branches to the subroutine caller 2. When this conditional branch instruction is not taken to any branches, another loop of the function-4 5 is fetched and executed. After the function-4 5 is fetched and executed, the subroutine caller 6 calls the function-2 9 again. All of the NIs including the returner in the function-2 9 are fetched and executed. One of 'X' NIs in the basic block-3 7 is also a conditional branch instruction, which takes a branch to the basic block-2 4. A cycle of the software/assembly program 31 in A-1 is complete if the conditional branch instruction does not take any branches. The last instruction in the basic block-3 7 is a jump instruction to take a branch to the basic block-1 1. This jump instruction is considered as another basic block according to the definition of a basic block in prior arts. The 'M' and 'N' are positive numbers, which are greater than equal to one.

In one embodiment, an example of the software/assembly program 31 is also shown as A-2, which includes different functions, such the function-1 8 as an interrupt service routine containing 'Y' NIs and the function-2 9 as a subroutine containing 'Z' NIs. The function-1 8 is fetched and executed whenever an interrupt needs to be executed. The operation of the interrupt is: to hold the currently processing instructions on the pipeline in a microprocessor; to start to fetch and execute the instructions in the function-1 8; and to resume fetching and executing the instructions held by processing the instructions in the interrupt service routine 8. Therefore, the values of the program counter to fetch the first instruction of the function-1 8 and to resume fetching the instruction held by the interrupt are stored to a stack 72 as done in prior arts. The function-2 9 is fetched and executed when the subroutine caller 2 and 6 are fetched and executed. Therefore, any disrupted operations, such as branch misprediction correction, occurred in microprocessors 70 are performed in similar manner.

In one embodiment, the BIs A-3 and the non-BIs A-4 are disassembled from the software/assembly program 31 shown in A-1. The disassembling operations of the software/assembly program 31 are shown by the dashed line arrows. BIs A-3 consist of seven BIs, which represent the seven segments of the instructions excluding the jump instruction in the basic block-3 7 in the software/assembly program 31. The BI-1 10 represents the basic block-1 1, which does not contain any branch instructions. The BI-1 10 contains encoded information for accessing the non-BI-1 20, which contains 'S' NIs. Therefore, all of the same 'S' NIs are found in the non-BI-1 20 through a single or plurality of dynamic BI/non-BI assembling and delivering systems 80. The BI-4 13 and the BI-6 16, respectively, represent the basic block-2 4 and the basic block-3 7. Since each of these basic blocks 4, 7 contains a conditional branch instruction, the BI-4 13 contains encoded information for accessing the non-BI-4 23, which contains 'V' NIs including the conditional instruction. However, the BI-6 16 contains additional a jump instruction. This jump instruction is not necessary to be included to the non-BI-6 25. Therefore, the non-BI-6 25 can only contain 'X1' NIs, which are one fewer NIs than the 'X' NIs found in the basic block-3.

The BI-2 11 represents the subroutine callers 2, 6. The BI-2 11 provides information to fetch the associated non-BI-2 21. Since a subroutine returner in the function-2 9 is not necessary to fetch and execute for resuming fetching the NIs in the function-3 3, this returner can be removed from the non-BI-6 instruction 25. Therefore, the non-BI-2 21 contains 'Z1' NIs if necessary. The BI-3 12 and BI-5 14, respectively, represent the loop function-3 3 and the loop function-4 5. The BI-3 12 and BI-5 14, respectively, contain the encoded information to access the non-BI-3 22 and the non-BI-5 24, the encoded conditional branch instruction for look-ahead branch predictions, and the encoded information not to fetch the NIs in the non-BI-3 22 and the non-BI-5 24 from the non-BI memories 41 via the non-BI L1/L2 caches 42, 43.

Therefore, the non-BI-3 22 and the non-BI-5 24 reduce branch prediction speed as well as eliminate the fetch cycles of the NIs in the loops once the NIs associated in the non-BI-3 22 and the non-BI-5 24. This feature can replace the trace cache and the loop cache used in prior arts with the invention. The non-BI-3 22 and the non-BI-5 24, respectively, can have the same or fewer NIs than the NIs found in the loop function-3 3 and the loop function-4 5.

FIG. 3 is a diagram showing one embodiment of organizations and operations of a single or plurality of BI queues (BIQs) in the BI fetch unit and a single or plurality of non-BIQs and/or IQs in the non-BI fetch unit and scaling operations of BIs and non-BIs for parallel fetch to a single or plurality of BIQs in the BI fetch unit and non-BI queues (non-BIQs) and/or IQs in the non-BI fetch unit.

In one embodiment, an example of scaling or non-scaling of BIs/non-BIs for parallel fetch to a single or plurality of NIQs in the non-BI fetch units 63. All of the 'S' NIs of the basic block-1 1 are disassembled to a non-BI-1 instruction 20 if the non-BIs are not scaled. A single or plurality of NIs of the non-BI-1 instruction 20 is stored to the NIQs of the non-BI fetch units 63 in order after the BI-1 instruction 10 is fetched to the BIQs of the BI fetch units 61. The non-BPCs and/or NPCs of the non-BI fetch units 63, respectively, are updated until the non-BI-1 instruction and/or the last NI of the non-BI-1 instruction 20 are stored to the non-BIQ and/or IQ of the non-BI fetch units 63. Therefore, 'S' cycles are taken to store the 'S' NIs to the NIQ of the non-BI fetch units 63 when one NI can fetch to the NIQ. One cycle is taken to store the non-BI to the non-BIQ of the non-BI fetch units 63 when one non-BI can fetch to the non-BIQ.

Every four NIs of the 'S' NIs of the same basic block-1 1 are disassembled to a plurality of non-BIs if the non-BIs are scaled by four during the BI/non-BI disassembling time. A single or plurality of BIs is disassembled if 'S' is greater than four. Accordingly, each BI represents up to four disassembled non-BI and/or NIs. Therefore, each non-BI represents a single or plurality of NIs. More specifically, variable-length instructions can be scaled by a certain number of bytes (i.e., 32-byte, 64-byte, 128-byte, and other number of bytes) for the scaling operation while fixed-length instructions can be scaled by a single or plurality of instruction length.

In the case of scaling by four 32-bit fixed-length instructions or a single or plurality of variable-length instructions within four 32-bit, a single or plurality of non-BIs of the BI-1 instruction 10 can be fetched concurrently from the concurrently accessible non-BI memory 41 and caches 42, 43. Thus, a single or plurality of non-BIQs in the non-BI fetch units 63 is used for storing non-BIs to the non-BIQs. A single or plurality of NIQs in the non-BI fetch units 63 is used for storing NIs of non-BIs to the NIQs in the non-BI fetch units 63.

In one embodiment, a single or plurality of BIQs in the BI fetch units 61 stores a single or plurality of BIs fetched from the BI caches 45, 46 and forwards a single or plurality of BIs to a single or plurality of BI decode units 62. A single or plurality of branch BIs requiring branch predictions transfers to the BLA branch prediction units 65. The branch prediction results including the branch target addresses of the BIs are updated to a single or plurality of BPCs in the BI fetch units 61. The other BIs are decoded for extracting addresses of the non-BIs. A single or plurality of non-BIs fetched from the non-BI caches 42, 43 are stored to a single or plurality of non-BIQs. More specifically, a single or plurality of variable-length or fixed-length NIs fetched from the non-BI caches 42, 43 are stored to a single or plurality of NIQs in the non-BI fetch units 63.

In one embodiment, a single or plurality of non-BIQs and/or NIQs in the non-BI fetch units 63 stores a single or plurality of non-BI and/or NIs fetched from the non-BI caches 42, 43 and forwards a single or plurality of non-BI and/or NIs to the non-BI decode units 64. The non-BIs are decoded for extracting addresses of the NIs of the associated non-BIs if variable-length NIs are used in the software/assembly program 31. The non-BI decode units 64 also decode the NIs received from the NIQs. The non-BI decode units 64 only decode NIs if fixed-length NIs are used in the software/assembly program 31. The decode results are forwarded to a single or plurality of backend processing engines 73.

In one embodiment, a non-scaled BI is fetched to a single BIQ in the BI fetch units 61 according to the BI program order directed by the values stored in a BPC in the same BI fetch units 61 as seen in B-1. Eight BIs are fetched to the single entry BIQ every BI clock cycle, which can be twice fast as the microprocessor clock cycle.

In one embodiment, a plurality of non-scaled BIs is fetched to a plurality of BIQs in the BI fetch units 61 according to the BI program order directed by the values stored in a plurality of BPCs in the same BI fetch unit 61 as seen in B-2. Eight BIs are fetched to two BIQs every BI clock cycle, which can be twice fast as the microprocessor clock cycle. Alternatively, two BIs in the twice-shorten format can be fetched the same width of the single BIQ every BI clock cycle.

In one embodiment, a non-scaled non-BI is fetched to a single non-BIQ in the non-BI fetch units 63 according to the non-BI program order directed by the values stored in a non-BPC in the same non-BI fetch units 63 as seen in B-3. Eight non-BIs are fetched to the single entry non-BIQ every non-BI clock cycle, which can be twice fast as the microprocessor clock cycle. Two of the eight non-BIs, such as non-BI-2 21, are assembled from the same BI, BI-2 11. The other non-BIs are assembled from the associated BIs shown in B-1. Thus, those non-BIs, such as non-BI-1 20, non-BI-2 21, non-BI-3 22, non-BI-4 23, non-BI-5 24, non-BI-6 25, and non-BI-7 26, represent a single or plurality of NIs, such as 'S' instructions 20, 'Z1' instructions 21, 'U1' instructions 22, 'V' instructions 23, 'W1' instructions 24, 'X1' instructions 25, and 'Y1' instructions 26. Each non-scaled NI, such as a fixed-length instruction or a single or plurality of variable-length instructions in a fixed single or plurality of length of bytes, is fetched to a single NIQ in the non-BI fetch units 63 by the values stored in a NPC in the same non-BI fetch units 63 as seen in B-4.

In prior arts, each NI is fetched to the microprocessor in every clock cycle if necessary. Branch instructions, such as conditional branch instructions, are predicted in the order of the program whenever the conditional branches are fetched. However, the invention fetches BIs in the BI program order for predicting BIs that represent the conditional branch instructions. Since each BI represents a single or plurality of NIs, conditional branch BIs are delivered to the BLA branch prediction units 65 earlier than the cycles taken to deliver native conditional branch instructions to the branch prediction units found in prior arts. Consequently, speed of branch prediction is enhanced for achieving higher performance of a single or plurality of microprocessors.

In one embodiment, a single or plurality of non-scaled NIs, such as a single or plurality of fixed-length instructions or a single or plurality of variable-length instructions in a single or plurality of fixed single or plurality of length of bytes, is fetched to a plurality of NIQs in the non-BI fetch units 63 by the values stored in a plurality of PCs in the same non-BI fetch units 63 as seen in B-5. In order to do so, a single or plurality of BIs and/or non-BIs needs to be fetched concurrently. B-5 illustrates up to two non-scaled NIs are fetched to two independently operating NIQs.

In one embodiment, a plurality of scaled non-BIs is fetched to a plurality of non-BIQs in the non-BI fetch units according to the non-BI program order directed by the values stored in a plurality of non-BPCs in the same non-BI fetch units 63 as seen in B-6. More specifically, scaled non-BIs represented fewer NIs than non-scaled non-BIs of the same software/assembly program 31. B-6 illustrates that non-BIs, such as non-BI-4 23 and non-BI-5 24, are scaled. The scaled non-BIs, such as non-BI-4A 23-A and non-BI-4B 23-B, represent the same NIs, which are represented by the non-scaled non-BI, non-BI-4 23. Similarly, non-BI-5A 24-A and non-BI-5B 24-B are scaled from the non-BI-5 24. Two non-BIs are fetched to two non-BIQs every non-BI clock cycle, which can be twice fast as the microprocessor clock cycle. Alternatively, two non-BIs in the twice-shorten format can be fetched the same width of the single non-BIQ every non-BI clock cycle.

In one embodiment, a plurality of scaled NIs is fetched to a plurality of NIQs in the non-BI fetch units 63 according to the NI program order directed by the values stored in a plurality of PCs in the same non-BI fetch units 63 as seen in B-7. More specifically, the NIs scaled by four represent up to four NIs represented by a scaled non-BI. B-7 illustrates that the NIs scaled by four, such as NI-1-1, NI-1-4, and the other NIs 100, are fetched to two NIQs in the non-BI fetch units 63. The scaled NIs 100 represent the same NIs, which are represented by the non-scaled non-BI, non-BI-1 20. Similarly, NI-7-1, NI-7-4, and the other NIs 106 are scaled from the non-BI-7 26. Two NIs are fetched to two NIQs every NI fetching cycle, which can be twice fast as the microprocessor clock cycle.

What is claimed is:

1. An apparatus for producing a branch look-ahead (BLA) instruction disassembling, assembling, and delivering system comprising:

a BLA instruction/non-BLA instruction (BI/non-BI) disassembling system;

a single or plurality of dynamic BI/non-BI assembling and delivering systems; and a single or plurality of backend microprocessors; wherein the apparatus for producing the BI disassembling, assembling, and delivering system is operable to:

identify each BI comprising an entire or a part of a basic block with or without including a branch or flow control instruction required to be predicted by a branch predictor, from a software and/or assembly program for generating a BI program and a non-BI program wherein the basic block is an instruction segment with only one entry and only one exit in the program;

compose a BI program comprising BIs and/or some non-BIs with additional information to access a single or plurality of the non-BIs associated to each BI if necessary;

deliver the BIs from the BI program to a single or plurality of the microprocessors according to the BI fetch order while delivering the non-BIs from the non-BI program to the microprocessors according to the non-BI fetch order obtained from the associated BI;

deliver a single or plurality of BIs to the branch predictor for predicting a single or plurality of locations of next BIs in the BI program and start to deliver the next BIs to the microprocessors while continuously delivering the non-BIs associated previous or current BIs delivered to the microprocessors; and produce a single or plurality of branch prediction results of the BIs before completely fetching non-BIs of the associated BIs;

wherein the BI disassembling, assembling, and delivering system is further operable to:

disassemble native instruction (NIs) in a software and/or assembly program to a BI program and a non-BI program;

compose a BI comprising a single or plurality of other BIs and/or non-disassembled NIs;

compose a single or plurality of BIs representing a single or plurality of levels of loops in the software and/or assembly program;

compose a non-BI comprising a single or plurality of other non-BIs and/or non-disassembled NIs;

compose a single or plurality of non-BIs representing a single or plurality of levels of loops in the software and/or assembly program;

assign BIs and non-BIs to sequentially and/or concurrently accessible BI and non-BI main memories;

access BIs and non-BIs from the sequentially and/or concurrently accessible BI and non-BI main memories to the sequentially, concurrently, and/or a plurality of times more quickly accessible BI and non-BI caches, wherein the plurality of times more quickly accessible caches are two or more times faster than NI fetch speed of microprocessors;

assemble the NIs from the non-BI program and/or BI program during the NI fetch operation via a single or plurality of BI/non-BI prefetch/fetch systems;

prefetch the BIs addressed by BI prefetch/decode units to the BI caches;

prefetch the BIs addressed by the BLA systems to the BI caches whenever a single or plurality of branch target addresses is obtained from a single or plurality of BLA branch prediction units in the BLA systems or a single or plurality of interrupt processing units in the backend microprocessors;

terminate the BI prefetch after continuously prefetching BIs from both of predicted and non-predicted paths one or more times to the BI caches;

decode the prefetched BIs for prefetching the associated non-BIs and for prefetching variable-length native instructions (NIs) to the BI caches;

fetch the BIs addressed by BI fetch/decode units to the BLA systems;

fetch the BIs addressed by the BLA systems to the BLA systems whenever a single or plurality of branch target addresses is obtained from a single or plurality of BLA branch prediction units in the BLA systems or a single or plurality of interrupt processing units in the backend microprocessors;

decode the fetched BIs for fetching the associated non-BIs and for fetching fixed- and/or variable-length NIs to the BLA systems;

forward a single or plurality of the fetched BIs to a single or plurality of BI decode units via BI fetch units;

initiate branch prediction operations of the BIs received within a single or plurality of clock cycles ahead of comparing the branch prediction operations with NIs fetched and decoded in non-BI fetch units and non-BI decode units by identifying any BIs required to be predicted for their branch operations and branch target locations with the branch prediction information forwarded to the BLA branch prediction units;

initiate next BI and non-BI prefetch and fetch operations according to the branch prediction results available a single or plurality of clock cycles ahead for enhancing performance of the microprocessor by reducing taken-branch latencies;

filter BIs representing a single or plurality of loops by the BI decode units and hold further BIs fetched in the BI fetch units while reissuing same BIs representing the same single or plurality of loops to the BLA branch prediction units;

eliminate recursive BI and non-BI prefetching and fetching operations from a single or plurality of BI memory systems and non-BI memory systems (BI/non-BI memory systems) to the BLA systems via the BI/non-BI prefetch/fetch systems;

decode the BIs to redirect the associated non-BIs fetched to a single or plurality of non-BI queues (non-BIQs) in the non-BI fetch units if the fetched non-BIs and/or NIs in the non-BIQ are changed;

detect and process disrupting operations of BI, non-BI, and/or NI fetch, decode, and/or execution orders;

store current BI program counters (BPCs), non-BI program counters (BPCs), and/or native instruction program counters (NPCs) to a stack in order to resume disrupted operations of the BIs, non-BIs, and/or NIs;

update new NPC values to the BPCs in the BI fetch units and/or non-BPCs and/or NPCs in the non-BI fetch units to prefetch and/or fetch the BIs, non-BIs, and/or NIs from disrupted locations;

restore NPC values of the BPCs, non-BPCs, and/or NPCs stored in the stack to the BPCs and/or non-BPCs and/or NPCs;

reset a single or plurality of values of the non-BPCs and/or NPCs whenever last NIs of the associated non-BIs are fetched;

increase a single or plurality of values of the non-BPCs and/or NPCs whenever non-BIs and/or NIs of a next non-BIs are fetched or whenever first NIs of the associated non-BIs are fetched; and repeat resetting and increasing the values of the non-BPCs and/or NPCs until next non-BIs and/or the last NIs of the non-BIs are fetched.

2. The apparatus for producing a BLA instruction disassembling, assembling, and delivering system of claim 1, wherein the BLA instruction/non-BLA instruction (BI/non-BI) disassembling system is operable to:

disassemble BIs from the software and/or assembly program by creating a BI for representing a segment of the NIs in continuous execution order in the program;

disassemble a single or plurality of loops from the software and/or assembly program by creating a BI for representing the single or plurality of loops;

disassemble unconditional flow control instructions including unconditional jumps, subroutine callers and/or returners from the software and/or assembly program by creating associated BIs for undisrupted BI prefetch and/or fetch;

comprise an opcode and a single or plurality of information fields containing location information of a first NI of the segment in each BI;

assign different opcodes used in the NIs found the software and/or assembly program to the BIs;

identify number of the NIs encapsulated in a BI in an additional field in the BI;

distinguish the last NI in the non-BIs assembled by the BI by assigning a different bit value of the last NI from a bit value of the other NIs and storing the associated bits and NIs in a dedicated main non-BI memory;

disassemble non-BIs from the software and/or assembly program by creating a non-BI for representing a segment of the variable-length NIs in continuous execution order in the program;

disassemble a single or plurality of loops from the software and/or assembly program by creating a non-BI for representing the single or plurality of loops comprising a single or plurality of segments of the variable-length NIs;

disassemble unconditional flow control instructions including unconditional jumps, subroutine callers and/or returners from the software and/or assembly program by creating associated non-BIs for undisrupted non-BI prefetch and/or fetch;

compose a non-BI with NIs and associated information of the BI;

disassemble NIs representing a segment of the fixed-length NIs in continuous execution order from the software and/or assembly program; and disassemble NIs representing a single or plurality of loops comprising the fixed-length NIs from the software and/or assembly program.

3. The apparatus for producing a BLA instruction disassembling, assembling, and delivering system of claim 1, wherein the single or plurality of dynamic BI/non-BI assembling and delivering systems further comprises:

a single or plurality of BI/non-BI memory systems;
a single or plurality of BI/non-BI prefetch/fetch systems; and
a single or plurality of the BLA systems;
wherein the apparatus for producing the dynamic BI/non-BI assembling and delivering systems is operable to:
assemble the non-BI program stored in the non-BI memories via the non-BI caches according to the associated BI program stored in BI memories and caches after delivering BIs to the BI/non-BI prefetch/fetch systems during BI assembling and delivering;
allocate the BIs and non-BIs separately to the different locations of the sequentially, concurrently, and/or a plurality of times more quickly accessible caches and main memories in the BI/non-BI memory systems;
prefetch and/or fetch sequentially and/or concurrently the BI/non-BIs addressed by associated BPCs and/or non-BPCs in the BI/non-BI prefetch/fetch systems via the BI and/or non-BI memory systems;
fetch the BIs from locations addressed by the BPCs in the BI fetch/decode units whenever the associated BPCs in the BI fetch/decode units are updated with new NPC values by decoding the fetched BI with the BI fetch/decode units;
fetch the BIs from the locations received by the NPC values from the BLA systems whenever a single or plurality of branch target addresses is obtained via the BLA branch prediction units;
fetch the BIs from the locations addressed by the interrupt processing units in the backend microprocessors;
fetch variable-length NIs from the NPC values stored in NPCs in the non-BI fetch units;
provide a single or plurality of new non-BPC values for fetching associated non-BIs to the non-BI fetch units and to non-BPCs by decoding the fetched BIs;
store the non-BIs in the sequentially, concurrently, and/or a plurality of times more quickly accessible caches and main memories;
prefetch the non-BIs from locations addressed by program counters in non-BI prefetch units whenever associated BIs are prefetched by BI prefetch units;
prefetch the non-BIs addressed by the non-BPCs by accessing initial locations of the NIs in the non-BIs;
prefetch other NIs consecutively located in the same non-BIs until a termination value of the last NIs of the non-BIs are prefetched;
prefetch variable-length NIs by the NPC values stored in the NPCs in the non-BI prefetch units;
update the NPC values stored in the non-BPCs for prefetching next non-BIs;
fetch the non-BIs from locations addressed by program counters in the non-BI fetch units whenever associated BIs are fetched by the BI fetch units;
fetch the non-BIs addressed by the non-BPCs by accessing the initial locations of the NIs in the non-BIs;
fetch the other NIs consecutively located in the same non-BIs until the termination values of the last NIs of the single or plurality of non-BIs is fetched;
fetch variable-length NIs by NPC values stored in the NPCs in the non-BI prefetch units;
update a single or plurality of NPC values stored in the non-BPCs for fetching the next non-BIs;
fetch non-BIs before decoding a single or plurality of non-BIs and/or NIs;
transmit decode results of the fetched non-BIs and/or NIs to the backend processing engines in the backend microprocessors;
store the BIs fetched from the BI/non-BI memory systems via the BI/non-BI prefetch/fetch systems in BIQs in BI fetch units;
update next BI addresses to the BPCs in the BI fetch units if the current BIs do not represent any branch instructions fetched;
update the BPCs with a single or plurality of addresses of the BIs at the branch target locations if the current BIs represent the branch instructions fetched;
fetch BIs from the BIQs to the BI decode units if the BIQs are used;
decode the fetched BIs from the BIQs or directly forwarded from the BI fetch units at the BI decode units;
decode the BIs to redirect associated non-BIs fetched to the non-BIQs in the non-BI fetch units if the fetched non-BIs in the non-BIQs are changed at the BI decode units;
screen any BIs required to have their branch operations and branch target locations predicted by the BI decode units;

forward information for branch prediction to the BLA branch prediction units;
initiate the branch prediction of the BIs received from the BI decode units within a single or plurality of clock cycles ahead of comparing the branch prediction with the NIs fetched and decoded in the non-BI fetch units and the non-BI decode units;
initiate the next BI and non-BI prefetch and fetch operations with branch prediction results available a single or plurality of clock cycles ahead for reducing taken-branch latencies and consequently enhancing performance of the microprocessors;
filter a BI representing a loop by the BI decode units and hold further BI fetch operations in the BI fetch units while reissuing same BIs representing the same loop to the BLA branch prediction units;
eliminate recursive BI and non-BI prefetching and fetching operations from the BI/non-BI memory systems to the BLA systems via the BI/non-BI prefetch/fetch systems;
detect and process disrupted BI and non-BI fetch, decode, and/or execution orders;
push the current BPCs, non-BPCs, and/or NPCs to the stack in order to resume the disrupted BI, non-BI, and/or NI operations;
update new NPC values to the BPCs, non-BPCs, and/or NPCs;
prefetch and fetch the BI, non-BI, and/or NIs from the disrupted locations in the program;
retrieve the values of the BPCs, non-BPCs, and/or NPCs stored in the stack to the BPCs, non-BPCs and/or NPCs after the disrupted operations are completed;
reset a single or plurality of values of the non-BPCs and/or values of NPCs whenever last NIs of the associated non-BIs are fetched;
increase the values of the non-BPCs and/or NPCs whenever non-BIs and/or NIs of the next non-BIs are fetched;
reset the values of the non-BPCs and/or NPCs whenever the first NIs of associated non-BIs are fetched;
increase the values of the non-BPCs and/or the values of NPCs whenever non-BIs and/or NIs of the same non-BIs are fetched; and
continue updating the non-BPCs and/or NPCs until the next non-BIs and/or the last NIs of the non-BIs are fetched.

4. The apparatus for producing a BLA instruction disassembling, assembling, and delivering system of claim 3, wherein the single or plurality of BI/non-BI memory systems further comprises:
a single or plurality of BI memories;
a single or plurality of levels of BI caches;
a single or plurality of non-BI memories; and
a single or plurality of levels of non-BI caches; wherein the BI/non-BI memory system is operable to:
allocate the BIs in the BI program and non-BIs in the non-BI program to different locations of the sequentially, concurrently, and/or a plurality of times more quickly accessible caches and main memories separately;
access same or different sizes of same or different numbers of banks from the levels of the caches in the sequentially, concurrently, and/or a plurality of times more quickly accessible BI and non-BI caches and main memories if necessary;
prefetch non-BIs concurrently by allocating the NIs of consecutive BIs to the different banks in the sequentially, concurrently, and/or a plurality of times more quickly accessible non-BI caches and main memories;
store a non-BI located right after a branch instruction in the program to a different bank where the non-BIs are located at the branch target locations of the branch instructions for the concurrent prefetch and/or fetch;
store the non-BIs to the different banks of the non-BI main memories in a circular manner for reassembling the NIs from the associated non-BIs;
store the BIs to different locations of the sequentially, concurrently, and/or a plurality of times more quickly accessible BI main memories;
access same or different sizes of a same or different number of banks from a single or plurality of the sequentially, concurrently, and/or a plurality of times more quickly accessible BI main memories during BI assembling and delivering;
store a single or plurality of BIs to same or different sizes of a same or different number of banks in the levels of the caches in the sequentially, concurrently, and/or a plurality of times more quickly accessible BI caches during BI assembling and delivering;
store the BIs to different locations of the sequentially, concurrently, and/or a plurality of times more quickly accessible levels of BI caches;
access same or different sizes of a same or different number of banks from a single or plurality of the sequentially, concurrently, and/or a plurality of times more quickly accessible BI caches;
store a single or plurality of BIs to a single or plurality of BI prefetch and decode units, a single or plurality of BI fetch and decode units, and/or a single or plurality of BLA systems;
store the non-BIs and/or NIs in the non-BI program to different locations of the sequentially, concurrently, and/or a plurality of times more quickly accessible non-BI main memories;
access same or different sizes of a same or different number of banks from a single or plurality of the sequentially, concurrently, and/or a plurality of times more quickly accessible non-BI main memories during non-BI assembling and delivering;
store a single or plurality of non-BIs to same or different sizes of a same or different number of banks in a single or plurality of levels of the caches in the sequentially, concurrently, and/or a plurality of times more quickly accessible non-BI caches;
store the non-BI and/or NIs to different locations of the sequentially, concurrently, and/or a plurality of times more quickly accessible non-BI caches at a single or plurality of levels;
access the same or different sizes of a same or different number of banks from a single or plurality of the sequentially, concurrently, and/or a plurality of times more quickly accessible non-BI caches during non BI assembling and delivering; and
store a single or plurality of non-BIs and/or NIs to a single or plurality of non-BI prefetch units, a single or plurality of non-BI fetch units, and/or a single or plurality of BLA systems.

5. The apparatus for producing a BLA instruction disassembling, assembling, and delivering system of claim 3, wherein the single or plurality of BI/non-BI prefetch/fetch systems further comprises:

a single or plurality of BI prefetch and decode units;
a single or plurality of prefetch BPCs;
a single or plurality of BI fetch and decode units;
a single or plurality of fetch BPCs;
a single or plurality of non-BI prefetch units;
a single or plurality of prefetch non-BPCs;
a single or plurality of non-BI fetch units; and
a single or plurality of fetch non-BPCs; wherein the apparatus for producing the single or plurality of BI/non-BI prefetch/fetch systems is operable to:
  assemble non-BIs stored in the non-BI main memories via the non-BI caches according to the associated BIs stored in the BI main memories and caches after delivering BIs to the BI/non-BI prefetch/fetch systems during BI/non-BI assembling and delivering;
  prefetch BIs from locations addressed by the program counters in a single or plurality of BI prefetch/decode units whenever the associated BPCs in the BI prefetch/decode units are updated with new NPC values by decoding the prefetched BIs with the BI prefetch/decode units or by receiving the NPC values from the BLA systems;
  receive the new NPC values for prefetching BIs from the BLA systems whenever a single or plurality of branch target addresses is obtained via BLA branch prediction units in the BLA systems or interrupt processing units in the backend microprocessors;
  terminate current BI prefetch operations after prefetching BIs in two different paths for a precise BI prefetch, when conditional BIs in the program representing any conditional branch instructions requiring branch prediction are detected;
  decode the prefetched BIs to provide new non-BPC values for prefetching associated non-BIs to the non-BI prefetch units and non-BPCs and/or to provide the NPC values stored in the NPCs in the non-BI prefetch units for prefetching variable-length NIs;
  fetch the BIs from locations addressed by the program counters in the BI fetch/decode units whenever associated BPCs in the BI fetch/decode units are updated with new NPC values by decoding the fetched BIs with the BI fetch/decode units or by receiving the NPC values from the BLA systems;
  receive the new NPC values for fetching BIs from the BLA systems whenever a branch target address is obtained via the BLA branch prediction units in the BLA systems or the interrupt processing units in the backend microprocessors;
  decode the fetched BIs to provide a new non-BPC values for fetching the associated non-BIs to the non-BI fetch units and non-BPCs and/or to provide the NPC values stored in the NPCs in the non-BI fetch units for fetching variable-length NIs;
  store the fetched BIs in BIQs or forward to the BI decode units via the BI fetch units;
  screen any BIs required to be predicted their branch operations and branch target locations;
  forward information for branch prediction to the BLA branch prediction units;
  initiate the branch prediction operations of the BIs received within a single or plurality of clock cycles ahead of comparing the branch prediction operations with NIs fetched and decoded in the non-BI fetch units and the non-BI decode units;
  initiate next BI and non-BI prefetch and fetch operations according to branch prediction results available a single or plurality of clock cycles ahead for enhancing performance of the microprocessor by reducing taken-branch latencies;
  filter BIs representing a single or plurality of loops by the BI decode units and hold further BIs fetched in the BI fetch units while reissuing the BIs representing the single or plurality of loops to the BAL branch prediction units; and
  eliminate recursive BI and non-BI prefetching and fetching operations from the BI/non-BI memory systems to the BLA systems via the BI/non-BI prefetch/fetch systems.

6. The apparatus for producing a BLA instruction disassembling, assembling, and delivering system of claim 5, wherein the single or plurality of BI prefetch and decode/fetch units is operable to:

prefetch BIs addressed by associated BPCs via the BI/non-BI memory systems;
prefetch a BI representing a native branch target instruction from one path and a BI located at a next location in the BI program from another path;
prefetch continuously a BI representing a native unconditional branch instruction providing their branch target address from a branch target location of the BI;
discard unconditional BIs after obtaining its branch target locations in order not to fetch the unconditional BIs to the backend microprocessors via the BLA systems;
obtain branch target addresses from various branch predictors, using branch target buffers if necessary;
terminate a precise BI prefetch after prefetching BIs in two different paths, when conditional BIs representing any conditional branch instructions requiring branch prediction are detected;
decode the prefetched BIs to prefetch associated non-BIs;
provide a single or plurality of addresses for sequentially and/or concurrently prefetching BIs from the BI memories via the levels of BI caches;
receive a single or plurality of NPC values from the BLA systems for resuming a single or plurality of BI prefetch operations;
fetch sequentially and/or concurrently BIs addressed by associated BPCs from the BI memories via the levels of BI caches;
fetch the BIs from locations addressed by the BPCs in the BI fetch/decode units whenever associated BPCs in the BI fetch/decode units are updated with new NPC values by decoding the fetched BIs with the BI fetch/decode units;
fetch the BIs from locations received by the NPC values from the BLA systems whenever a branch target address is obtained via BLA branch prediction units in the BLA systems;
fetch the BIs from locations addressed by interrupt processing units in the backend microprocessors;
fetch variable-length NIs from the NPC values stored in the NPCs in the non-BI fetch units;
provide a single or plurality of addresses for sequentially and/or concurrently fetching the BIs from the BI memories via the levels of BI caches; and
receive a single or plurality of NPC values from the BLA systems for resuming a single or plurality of BI fetch operations.

7. The apparatus for producing a BLA instruction disassembling, assembling, and delivering system of claim 5, wherein the single or plurality of non-BI prefetch/fetch units is operable to:
  prefetch non-BIs from locations addressed by program counters in the non-BI prefetch units whenever associated BIs are prefetched by the BI prefetch/decode units;
  prefetch non-BIs addressed by non-BPCs by accessing initial locations of the NIs in the non-BIs;
  prefetch other NIs consecutively located in same non-BIs until termination values of last NIs of the non-BIs are prefetched;
  prefetch variable-length NIs by the NPC values stored in the NPCs in the non-BI prefetch units;
  update the single or plurality of NPC values stored in the non-BPCs for prefetching next non-BIs;
  provide a single or plurality of addresses for sequentially and/or concurrently prefetching the non-BI and/or NIs from the non-BI memories via the levels of non-BI caches;
  receive a single or plurality of NPC values from the BLA systems for resuming a single or plurality of non BLA and/or NI prefetch operations;
  fetch sequentially and/or concurrently non-BI and/or NIs addressed by associated non-BPCs from the non-BI memories via the levels of non-BI caches;
  fetch non-BI and/or NIs from locations addressed by program counters in the non-BI fetch units whenever associated non-BPCs in the non-BI fetch units are updated with new NPC values by decoding the fetched BIs with the BI fetch/decode units;
  fetch the non-BI and/or NIs from locations received by the NPC values from the BLA systems whenever a branch target address is obtained via the BLA branch prediction units in the BLA systems;
  fetch the non-BI and/or NIs from locations addressed by interrupt processing units in the backend microprocessors;
  fetch the non-BI and/or NIs from locations addressed by the backend processing engines in the microprocessors for correcting mispredicted branches;
  fetch variable-length NIs from the NPC values stored in the NPCs in the non-BI fetch units;
  provide a single or plurality of addresses for sequentially and/or concurrently fetching the non-BI and/or NIs from the non-BI memories via the levels of non-BI caches; and
  receive a single or plurality of NPC values from the BLA systems for resuming a single or plurality of non-BI and/or NI fetch operations.

8. The apparatus for producing a BLA instruction disassembling, assembling, and delivering system of claim 3, wherein the single or plurality of BLA systems further comprises:
  a single or plurality of BI fetch units;
  a single or plurality of BI decode units;
  a single or plurality of BIQs;
  a single or plurality of BPCs;
  a single or plurality of BLA branch prediction units;
  a single or plurality of non-BI fetch units;
  a single or plurality of non-BI decode units;
  a single or plurality of non-BIQs;
  a single or plurality of non-BPCs;
  a single or plurality of NIQs for NIs; and
  a single or plurality of NPCs for NIs;

wherein the apparatus for producing the single or plurality of BLA systems is operable to:
  store fetched BIs to BIQs or forward to the BI decode units via the BI fetch units;
  screen any BIs required to be predicted their branch operations and branch target locations;
  forward information for branch prediction to the BLA branch prediction units;
  initiate the branch prediction operations of the BIs received a single or plurality of clock cycles ahead of comparing the branch prediction operations with NIs fetched and decoded in the non-BI fetch units and the non-BI decode units;
  initiate next BI and non-BI prefetch and fetch operations according to branch prediction results available a plurality of clock cycles ahead for enhancing performance of the microprocessor by reducing taken-branch latencies;
  filter BIs representing a single or plurality of loops by the BI decode units and hold further BIs fetched in the BI fetch units while reissuing BIs representing a same single or plurality of loops to the BLA branch prediction units;
  eliminate recursive BI and non-BI prefetching and fetching operations from the BI/non-BI memory systems to the BLA systems via the BI/non-BI prefetch/fetch systems;
  decode the BIs to redirect associated non-BI and/or NIs fetched to the non-BIQs in the non-BI fetch units if the fetched non-BIs and/or NIs in the non-BIQs are changed;
  detect and process disrupted operations of BI, non-BI, and/or NI fetch, decode, and execution orders by the interrupt processing units;
  store current BPCs, non BPCs, and/or NPCs to a stack in order to resume the disrupted operations of the BIs, non-BIs, and/or NIs;
  update new NPC values to the BPCs in the BI fetch units and/or non-BPCs and/or NPCs in the non-BI fetch units to prefetch and/or fetch the BIs, non-BIs, and/or NIs from disrupted locations;
  restore values of the BPCs, non-BPCs, and/or NPCs stored in the stack to the BPC and/or non-BPC and/or NPC;
  reset values of the non-BPCs and/or values of NPCs whenever last NIs of the associated non-BIs are fetched;
  increase the values of the non-BPCs and/or NPCs whenever a non-BI and/or a NI of a next non-BI are fetched or whenever first NIs of associated non-BIs are fetched;
  repeat resetting and increasing the values of the non-BPCs and/or NPCs until next non-BIs and/or last NIs of the non-BIs are fetched;
  transmit new NPC values for prefetching BIs to the BI memories and/or caches whenever a single or plurality of branch target addresses is obtained via the BLA branch prediction units in the BLA systems or the interrupt processing units in the backend microprocessors; and
  transmit the new NPC values for fetching BIs to the BI memories and/or caches whenever a single or plurality of branch target addresses is obtained via the BLA branch prediction units in the BLA systems or the interrupt processing units in the backend microprocessors.

9. The apparatus for producing a BLA instruction disassembling, assembling, and delivering system of claim 8, wherein the single or plurality of BI fetch units is operable to:
  fetch a single or plurality of BIs from the locations received by the BPCs from the BI caches and/or memories via the BI prefetch and fetch systems;
  fetch BIs from the BIQs to the BI decode units if the BIQs are used;
  store the fetched BIs to a single or plurality of entries of the BIQs by a same BI fetch order if the BIQs are used;
  forward the fetched BIs in the BIQs to the BI decode units in the BLA systems if the BIQs are used;
  adjust access pointers of the BIQs for writing next fetched BIs to and reading next decoded BIs from the BIQs;
  update next BI addresses to the BPCs in the BI fetch units if current BIs do not represent any branch instructions fetched;
  update the BPCs with a single or plurality of addresses of the BIs at branch target locations if current BIs represent branch instructions fetched;
  receive branch prediction results available a single or plurality of clock cycles ahead from the BLA branch prediction units;
  receive a single or plurality of NPC values of BPCs for performing disrupted operations of the BI fetch and/or decode orders branch misprediction corrections by the backend processing engines, and other disrupted operations that occurred in microprocessors;
  update new NPC values to the BPCs to prefetch and/or fetch the BIs from disrupted locations;
  restore NPC values of the BPC stored in a stack to the BPCs;
  forward again the fetched BIs representing a single or plurality of loops in BIQs to the BI decode units according to branch prediction results received; and
  hold BI fetch operations for fetching any BIs from the BI prefetch/fetch systems whenever forwarding the fetched BIs representing a single or plurality of loops in BIQs to the BI decode units.

10. The apparatus for producing a BLA instruction disassembling, assembling, and delivering system of claim 8, wherein the single or plurality of BI decode units is operable to:
  receive a single or plurality of fetched BIs from the BI fetch units in the BLA systems;
  decode the fetched BIs to provide new non-BPC values for fetching associated non-BIs to the non-BI fetch units and non-BPCs and/or to provide the NPC values stored in the NPCs in the non-BI fetch units for fetching fixed- and variable-length NIs;
  screen any BIs required to be predicted their branch operations and branch target locations;
  forward information for branch prediction to the BLA branch prediction units;
  filter BIs representing a single or plurality of loops while forwarding the BIs representing the single or plurality of loops to the BLA branch prediction units;
  decode the BIs to redirect associated non-BIs fetched to the non-BIQs in the non-BI fetch units if the fetched non-BIs and/or NIs in the non-BIQs are changed;
  transmit decoded information of the BIs to fetch associated non-BIs and/or NIs from the non-BI prefetch/fetch systems to the non-BI fetch units or to the non-BIQs in the non-BI fetch units if the non-BIQs are used;
  fetch a single or plurality of BIs sequentially or concurrently from the BI memories and caches via the BI prefetch/fetch systems;
  store the fetched BIs sequentially or concurrently through a single or plurality of entries of the BIQs;
  dispatch the fetched BIs sequentially or concurrently from a single or plurality of entries of the BIQs to the BI decode units;
  fetch and dispatch a non-scaled BI representing the non-BI disassembled or a segment of the entire NIs sequentially;
  fetch and dispatch a scaled BI representing a single or plurality of non-BIs disassembled or a single or plurality of sub-segments of the NI segment concurrently;
  hold a single or plurality of current BI addresses to fetch the BIs from the BI caches and/or memories via the BI prefetch and fetch systems to the BI fetch units in the BLA systems;
  update a single or plurality of next BI addresses if current BIs do not represent any branch instructions fetched;
  update a single or plurality of addresses of the BIs at the branch target locations if current BIs represent the branch instructions fetched;
  update values of the single or plurality of current or next BPCs to a stack in order to resume disrupted BI operations; and
  retrieve the NPC values stored in the stack to the BPCs after the disrupted operations are completed.

11. The apparatus for producing a BLA instruction disassembling, assembling, and delivering system of claim 8, wherein the single or plurality of BLA branch prediction units is operable to:
  receive information for branch prediction from the BI decode units;
  access other information for branch prediction from a single or plurality of other units including a branch predictor and a history table;
  produce new NPC values for prefetching and fetching BIs from the BLA systems whenever a single or plurality of branch target addresses is obtained via the BLA branch prediction units in the BLA systems;
  transmit the new NPC values for prefetching and fetching BIs to the BI fetch units whenever a single or plurality of branch target addresses is produced; and
  update necessary information for branch prediction to associated sub-units including the branch predictor and the history table.

12. The apparatus for producing a BLA instruction disassembling, assembling, and delivering system of claim 8, wherein the single or plurality of non-BI fetch/decode units is operable to:
  fetch sequentially and/or concurrently the non-BIs and/or NIs addressed by associated non-BPCs and/or NPCs from the non-BI memories via the levels of non-BI caches;
  fetch the non-BIs and/or NIs from locations addressed by program counters in the non-BI fetch units whenever associated non-BPCs and/or NPCs in the non-BI fetch units are updated with new NPC values by decoding the fetched BIs with the BI fetch units;
  fetch the non-BIs and/or NIs from the locations received by the NPC values from branch prediction units whenever a single or plurality of branch target addresses is obtained via the BLA branch prediction units;
  fetch the non-BIs and/or NIs from locations addressed by interrupt processing units in the backed microprocessors;

fetch the non-BIs and/or NIs from locations addressed by backend processing engines in the backend microprocessors for correcting mispredicted branches;

fetch variable-length NIs from the NPC values stored in the NPCs in the non-BI fetch units;

fetch non-BIs and/or NIs from the non-BIQs and/or NIQs to the non-BI decode units if the non-BIQs are used;

store the fetched non-BIs and/or NIs to a single or plurality of entries of the non-BIQs and/or NIQs in a same non-BI and/or NI fetch order if the BIQs are used;

store the fetched NIs to a single or plurality of entries of the NIQs in a same NI fetch order if the BIQs are not used;

forward the fetched non-BIs and/or NIs in the non-BIQs and/or NIQs to the non-BI decode units in the BLA systems if the BIQs are used;

adjust access pointers of the non-BIQs and/or NIQs for writing next fetched non-BIs and/or NIs to and reading next decoded non-BIs and/or NIs from the non-BIQs and/or NIQs;

update next non-BI and/or NI addresses to the non-BPCs and/or NPCs in the non-BI fetch units if the current non-BIs and/or NIs do not represent any branch instructions fetched;

update the non-BPCs and/or NPCs with a single or plurality of addresses of the non-BIs and/or NIs at the branch target locations if the current non-BIs and/or NIs represent the branch instructions fetched;

receive branch prediction results available a single or plurality of clock cycles ahead from the BLA branch prediction units;

receive a single or plurality of NPC values of non-BPCs and/or NPCs for performing disrupted operations of the non-BI and/or NI fetch and/or decode orders;

update new NPC values to the non-BPCs and/or NPCs to prefetch and/or fetch the non-BIs and/or NIs from disrupted locations;

restore NPC values of the non-BPCs and/or NPCs stored in a stack to the non-BPCs and/or NPCs;

forward again same fetched non-BIs and/or NIs representing a single or plurality of loops in the non-BIQs and/or NIQs to the decode units according to the branch prediction results received;

hold the non-BI and/or NI fetch operations for fetching any non-BIs and/or NIs from the non-BI prefetch/fetch systems whenever forwarding the same fetched non-BIs and/or NIs representing a single or plurality of loops in the non-BIQs and/or NIQs to the non-BI decode units;

receive a single or plurality of fetched non-BIs and/or NIs from the non-BI fetch units in the BLA systems;

decode the fetched non-BIs and/or native conditional branch instructions to provide new values of the non-BPCs and/or NPCs for fetching the non-BI and/or fixed- and variable-length NIs to the non-BI fetch units;

screen any non-BIs and/or NIs required to be predicted their branch operations and branch target locations if any BIs are not fetched;

forward information for branch prediction to the non-BI and/or native branch prediction units if any BIs are not fetched;

filter non-BIs and/or NIs representing a single or plurality of loops while forwarding same non-BIs and/or NIs representing the single or plurality of loops to the non-BI and/or native branch prediction units if any BIs are not fetched;

transmit decoded information of the non-BIs and/or NIs to fetch associated non-BIs and/or NIs from the non-BI prefetch/fetch systems to the non-BI fetch units if any BIs are not fetched or to the non-BIQs in the non-BI fetch units if the non-BIQs are used and any BIs are not fetched;

fetch a single or plurality of non-BIs and/or NIs fetched sequentially or concurrently from the non-BI memories and caches via the non-BI prefetch/fetch systems;

store the fetched non-BIs and/or NIs sequentially or concurrently through a single or plurality of entries of the non-BIQs and/or NIQs;

dispatch the fetched non-BIs and/or NIs sequentially or concurrently from a single or plurality of entries of the non-BIQs and/or NIQs to the non-BI decode units;

fetch and dispatch a single or plurality of non-scaled non-BIs and/or NIs sequentially;

fetch and dispatch a single or plurality of scaled non-BIs and/or NIs concurrently;

hold a single or plurality of current non-BI and/or NI addresses to fetch the non-BIs and/or NIs from the non-BI caches and/or memories via the non-BI prefetch and fetch systems to the non-BI fetch units in the BLA systems;

update a single or plurality of next non-BI and/or NI addresses if current non-BIs and/or NIs do not represent any branch instructions fetched;

update the single or plurality of addresses of the non-BIs and/or NIs at branch target locations if the current non-BIs and/or NIs represent branch instructions fetched;

update a single or plurality of current or next non-BPCs and/or NPCs values to a stack in order to resume disrupted non-BI and/or NI operations;

retrieve the NPC values stored in the stack to the non-BPCs and/or NPCs after the disrupted operations are completed;

fetch a single or plurality of NIs fetched sequentially or concurrently from the non-BI memories and caches via the non-BI prefetch/fetch systems if any BIs are not fetched;

store the fetched NIs sequentially or concurrently through a single or plurality of entries of the NIQs if any BIs are not fetched;

dispatch the fetched single or plurality of NIs sequentially or concurrently from a single or plurality of entries of the NIQs to the non-BI decode units if any BIs are not fetched;

fetch and dispatch a single or plurality of NIs sequentially if any BIs are not fetched;

hold a single or plurality of current NI addresses to fetch the NIs from the non-BI caches and/or memories via the non-BI prefetch and fetch systems to the non-BI fetch units in the BLA systems if any BIs are not fetched;

update a single or plurality of next NI addresses if current NIs do not represent any branch instructions fetched if any BIs are not fetched;

update the single or plurality of addresses of the NIs at branch target locations if current NIs represent the branch instructions fetched if any BIs are not fetched;

update a single or plurality of current or next NPCs' values to the stack in order to resume disrupted NI operations if any BIs are not fetched; and retrieve the NPC values stored in the stack to the NPCs after the disrupted operations are completed if any BIs are not fetched.

13. The apparatus for producing a BLA disassembling, assembling, and delivering system of claim 1, wherein the single or plurality of backend microprocessors comprises:
- a single or plurality of interrupt processing units;
- a single or plurality of stacks; and
- a single or plurality of backend processing engines;
  wherein the apparatus for producing the single or plurality of backend microprocessors is operable to:
  receive decode results of the fetched non-BIs and/or NIs from the non-BI decode units to the backend processing engines in the backend microprocessors;
  initiate a single or plurality of disrupted operations;
  receive values of the BPCs, non-BPCs, and/or NPCs to store the values to the stack for resuming currently disrupted BI, non-BI, and/or NI operations;
  transmit a single or plurality of the values of BPCs, non-BPCs, and/or NPCs for performing the disrupted operations of the BI, non-BI, and/or NI fetch and/or decode orders;
  transmit the values of the BPCs, non-BPCs, and/or NPCs stored in the stack to the BPCs, non-BPCs, and/or NPCs for resuming the disrupted BI, non-BI, and/or NI operations after completing currently disrupted operations;
  receive a single or plurality of interrupt requests;
  initiate a single or plurality of disrupted operations;
  receive the values of the BPCs, non-BPCs, and/or NPCs;
  store the BPCs, non-BPCs, and/or NPCs to the stack for resuming the currently disrupted BI, non-BI, and/or NI operations;
  transmit a single or plurality of values of the BPCs, non-BPCs, and/or NPCs for performing interrupt operations of the BI, non-BI, and/or NI fetch and/or decode orders;
  transmit the values of the BPCs, non-BPCs, and/or NPCs stored in the stack to the BPCs, non-BPCs, and/or NPCs for resuming the disrupted BI, non-BI, and/or NI operations after completing currently disrupted operations;
  initiate a single or plurality of disrupted operations;
  store the values of the BPCs, non-BPCs, and/or NPCs for resuming currently disrupted BI, non-BI, and/or NI operations;
  transmit the values of the BPCs, non-BPCs, and/or NPCs stored to the BPCs, non-BPCs, and/or NPCs for resuming the disrupted BI, non-BI, and/or NI operations after completing currently disrupted operations;
  receive decode results of the fetched non-BIs and/or NIs from the non-BI decode units;
  initiate a single or plurality of disrupted operations;
  receive the values of the BPCs, non-BPCs, and/or NPCs to store them to the stack for resuming the currently disrupted BI, non-BI, and/or NI operations;
  transmit a single or plurality of values of the BPCs, non-BPCs, and/or NPCs for performing the disrupted operations of the BI, non-BI, and/or NI fetch and/or decode orders; and
  transmit the values of the BPCs, non-BPCs, and/or NPCs stored in the stack to the BPCs, non-BPCs, and/or NPCs for resuming the disrupted BI, non-BI, and/or NI operations after completing currently disrupted operations.

14. A method comprising:
disassembling, by a branch look-ahead (BLA) instruction (BI) and non-BI disassembling system, native instructions (NIs) in a software and/or assembly program to a BI program and a non-BI program;
eliminating, by the BI and non-BI disassembling system, native branch instructions used in the software and/or assembly program;
composing, by the BI and non-BI disassembling system, BIs in the BI program comprising other BIs and non-disassembled NIs;
composing, by the BI and non-BI disassembling system, a single or plurality of BIs representing a single or plurality of levels of loops in the software and/or assembly program;
composing, by the BI and non-BI disassembling system, non-BIs in the non-BI program comprising other non-BIs and non-disassembled NIs;
composing, by the BI and non-BI disassembling system, a single or plurality of non-BIs representing a single or plurality of levels of loops in the software and/or assembly program;
allocating, by dynamic BI/non-BI assembling and delivering systems, BIs and non-BIs to different locations of sequentially, concurrently, and/or a plurality of times more quickly accessible caches and main memories;
assembling, by the dynamic BI/non-BI assembling and delivering systems, the non-BI program stored in non-BI memories via non-BI caches according to an associated BI program stored in BI memories and caches;
delivering, by the dynamic BI/non-BI assembling and delivering systems, BIs to BI/non-BI prefetch/fetch systems;
obtaining, by the dynamic BI/non-BI assembling and delivering systems, a single or plurality of branch target addresses via BLA branch prediction units in BLA systems or interrupt processing units in the backend microprocessors;
receiving, by the dynamic BI/non-BI assembling and delivering systems, new native program counter (NPC) values for prefetching BIs from the BLA systems;
updating, by the BI and non-BI prefetch and fetch systems, associated BI program counters (BPCs) in BI prefetch/decode units with new NPC values obtained by decoding prefetched BIs with the BI prefetch/decode units or by receiving NPC values from the BLA systems;
prefetching, by the BI and non-BI prefetch and fetch systems, the BIs from locations addressed by program counters in the BI prefetch/decode units;
prefetching, by the BI and non-BI prefetch and fetch systems, BIs in two different paths for precise BIs prefetching, when a conditional BI representing any native conditional branch instructions requiring branch prediction is detected;
terminating, by the BI and non-BI prefetch and fetch systems, current BI prefetching operations after prefetching the BIs in two different paths;
decoding, by the BI and non-BI prefetch and fetch systems, prefetched BIs to provide new non-BPC values for prefetching associated non-BIs to the non-BI prefetch units and non-BPCs and/or to provide a single or plurality of values stored in the NPCs in the non-BI prefetch units for prefetching variable-length NIs;
fetching, by the BI and non-BI prefetch and fetch systems, the BIs from locations addressed by program counters in BI fetch/decode units whenever associated BPCs in the BI fetch/decode units are updated with new NPC values by decoding fetched BIs with the BI fetch/ decode units or by receiving the NPC values from the BLA systems;

receiving, by the BI and non-BI prefetch and fetch systems, new NPC values for fetching BIs from the BLA systems whenever a branch target address is obtained via the BLA branch prediction units in the BLA systems or interrupt processing units in the backend microprocessors;

decoding, by the BI and non-BI prefetch and fetch systems, the fetched BIs to provide new non-BPC values for fetching associated non-BIs to non-BI fetch units and non-BPCs and/or to provide values stored in the NPCs in the non-BI fetch units for fetching variable-length NIs;

storing, by the BLA systems, the fetched BIs in BI queues (BIQs) or forwarding to the BI decode units via the BI fetch units;

screening, by the BI decode units, any BIs required to be predicted their branch operations and branch target locations;

forwarding, by the BI decode units, information for branch prediction to the BLA branch prediction units;

initiating, by the BLA branch prediction units, branch prediction operations of BIs received within a single or plurality of clock cycles ahead of comparing the branch prediction operations with NIs fetched and decoded in the non-BI fetch units and the non-BI decode units;

initiating, by the BLA systems, next BI and non-BI prefetch and fetch operations according to branch prediction results available a single or plurality of clock cycles ahead for enhancing performance of the microprocessor by reducing taken-branch latencies;

filtering, by the BI decode units, BIs representing a single or plurality of loops;

holding, by the BI decode units, further BIs fetched in the BI fetch units;

reissuing, by the BI decode units, BIs representing a same single or plurality of loops to the BLA branch prediction units;

eliminating, by the BLA systems, recursive BI and non-BI prefetching and fetching operations from BI/non-BI memory systems to the BLA systems via the BI/non-BI prefetch/fetch systems;

decoding, by the BI decode units, the BIs to redirect associated non-BIs fetched to non-BIQs in the non-BI fetch units if the fetched non-BIs and/or NIs in the non-BIQs are changed;

detecting and processing, by the BLA systems, disrupting operations of the BI, non-BI, and/or NI fetch, decode, and/or execution orders;

storing, by interrupt processing units or by the BLA systems, current BPCs, non-BPCs, and/or NPCs to a stack in order to resume the disrupted operations of the BI, non-BI, and/or NIs;

updating, by the BLA systems, new NPC values to the BPCs in the BI fetch units and/or non-BPCs and/or NPCs in the non-BI fetch units to prefetch and/or fetch the BI, non-BI, and/or NIs from disrupted locations;

restoring, by the BLA systems, NPC values of the BPCs, non-BPCs, and/or NPCs stored in the stack to the BPCs and/or non-BPCs and/or NPCs;

resetting, by the non-BI fetch units, a single or plurality of values of the non-BPCs and/or NPCs whenever last NIs of associated non-BIs are fetched;

increasing, by the non-BI fetch units, a single or plurality of values of the non-BPCs and/or NPCs whenever non-BIs and/or NIs of next non-BIs are fetched or whenever first NIs of the associated non-BIs are fetched; and repeating, by the non-BI fetch units, resetting and increasing the values of the non-BPCs and/or NPCs until the next non-BIs and/or the last NIs of the non-BIs are fetched.

15. The method of claim 14, wherein the BLA systems further comprise:
   a single or plurality of BI fetch units;
   a single or plurality of BIQs;
   a single or plurality of BPCs;
   a single or plurality of BI decode units;
   a single or plurality of BLA branch prediction units;
   a single or plurality of non-BI fetch units;
   a single or plurality of non-BIQs;
   a single or plurality of non-BPCs;
   a single or plurality of NI queues (NIQs) for NIs;
   a single or plurality of NPCs for NIs; and
   a single or plurality of non-BI decode units; wherein the single or plurality of BLA systems is operable to:
      store fetched BIs to BIQs or forward to the BI decode units via the BI fetch units;
      screen any BIs required to be predicted their branch operations and branch target locations;
      forward information for branch prediction to the BLA branch prediction units;
      initiate branch prediction operations of BIs received within a single or plurality of clock cycles ahead of comparing with the branch prediction operations with NIs fetched and decoded in the non-BI fetch units and the non-BI decode units;
      initiate next BI and non-BI prefetch and fetch operations according to branch prediction results available a plurality of clock cycles ahead for enhancing performance of the microprocessor by reducing taken-branch latencies;
      filter BIs representing a single or plurality of loops by the BI decode units and hold further BIs fetched in the BI fetch units while reissuing BIs representing a same single or plurality of loops to the BLA branch prediction units;
      eliminate recursive BI and non-BI prefetching and fetching operations from the BI/non-BI memory systems to the BLA systems via the BI/non-BI prefetch/fetch systems;
      decode BIs to redirect associated non-BIs and/or NIs fetched to the non-BIQs in the non-BI fetch units if fetched non-BIs and/or NIs in the non-BIQs are changed;
      detect and process disrupted operations of BI, non-BI, and/or NI fetch, decode, and execution orders by interrupt processing units;
      store the current BPCs, non-BPCs, and/or NPCs to a stack in order to resume the disrupted operations of the BI, non-BI, and/or NIs;
      update new NPC values to the BPCs in the BI fetch units and/or non-BPCs and/or NPCs in the non-BI fetch units to prefetch and/or fetch the BI, non-BI, and/or NIs from disrupted locations;
      restore values of the BPCs, non-BPCs, and/or NPC stored in the stack to the BPC and/or non-BPC and/or NPC;
      reset values of the non-BPCs and/or values of NPCs whenever last NIs of associated non-BIs are fetched;

increase values of the non-BPCs and/or NPCs whenever a non-BI and/or a NI of a next non-BI are fetched or whenever first NIs of associated non-BIs are fetched;

repeat resetting and increasing values of the non-BPCs and/or NPCs until next non-BIs and/or last NIs of the non-BIs are fetched;

transmit new NPC values for prefetching BIs to the BI memories and/or caches whenever a single or plurality of branch target addresses is obtained via the BLA branch prediction units in the BLA systems or the interrupt processing units in the backend microprocessors; and transmit new NPC values for fetching BIs to the BI memories and/or caches whenever a single or plurality of branch target addresses is obtained via the BLA branch prediction units in the BLA systems or the interrupt processing units in the backend microprocessors.

16. The method of claim 15, wherein the BI fetch/decode units are operable to:

fetch a single or plurality of BIs from locations received by the BPCs from the BI caches and/or memories via the BI prefetch and fetch systems;

fetch BIs from the BIQs to the BI decode units if the BIQs are used;

store the fetched BIs to a single or plurality of entries of the BIQs by a same BI fetch order if the BIQs are used;

forward the fetched BIs in the BIQs to the BI decode units in the BLA systems if the BIQs are used;

adjust access pointers of the BIQs for writing next fetched BIs to and reading next decoded BIs from the BIQs;

update the next BI addresses to the BPCs in the BI fetch units if the current BIs do not represent any branch instructions fetched;

update the BPCs with a single or plurality of addresses of the BIs at the branch target locations if the current BIs represent branch instructions fetched;

receive branch prediction results available a single or plurality of clock cycles ahead from the BLA branch prediction units;

receive a single or plurality of NPC values of BPCs for performing disrupted operations of the BI fetch and/or decode orders;

update new NPC values to the BPCs to prefetch and/or fetch the BIs from disrupted locations;

restore NPC values of the BPC stored in a stack to the BPCs;

forward again fetched BIs representing a single or plurality of loops in BIQs to the BI decode units according to branch prediction results received;

hold the BI fetch operations for fetching any BIs from the BI prefetch/fetch systems whenever forwarding the fetched BIs representing a single or plurality of loops in BIQs to the BI decode units;

fetch a single or plurality of BIs fetched sequentially or concurrently from the BI memories and caches via the BI prefetch/fetch systems;

store the fetched BIs sequentially or concurrently through a single or plurality of entries of the BIQs;

dispatch the fetched BIs sequentially or concurrently from a single or plurality of entries of the BIQs to the BI decode units;

fetch and dispatch a non-scaled BI representing the non-BI disassembled or a segment of the entire NIs sequentially;

fetch and dispatch a scaled BI representing a single or plurality of non-BIs disassembled or a single or plurality of sub-segments of the NI segment concurrently;

fetch a single non-scaled BI per BI fetch cycle in the BI fetch order to a single entry of BIQ;

fetch a plurality of non-scaled BIs per BI fetch cycle in the BI fetch order to a same plurality of entries of a single BIQ or to a same plurality of single entry BIQs;

fetch a single scaled BI per BI fetch cycle in the BI fetch order to a single entry of BIQ;

fetch a plurality of scaled BIs per BI fetch cycle in the BI fetch order to a same plurality of entries of a single BIQ or to a same plurality of single entry BIQs;

hold a single or plurality of current BI addresses to fetch the BIs from the BI caches and/or memories via the BI prefetch and fetch systems to the BI fetch units in the BLA systems;

update a single or plurality of next BI addresses if current BIs do not represent any branch instructions fetched;

update a single or plurality of addresses of the BIs at the branch target locations if current BIs represent branch instructions fetched;

update values of a single or plurality of current or next BPCs to a stack in order to resume disrupted BI operations;

retrieve NPC values stored in the stack to the BPCs after the disrupted operations are completed;

receive a single or plurality of fetched BIs from the BI fetch units in the BLA systems;

decode fetched BIs to provide new non-BPC values for fetching the associated non-BIs to the non-BI fetch units and non-BPCs and/or to provide the NPC values stored in the NPCs in the non-BI fetch units for fetching fixed- and variable-length NIs;

screen any BIs required to be predicted their branch operations and branch target locations;

forward information for branch prediction to the BLA branch prediction units;

filter BIs representing a single or plurality of loops while forwarding same BIs representing same single or plurality of loops to the BLA branch prediction units;

decode the BIs to redirect associated non-BIs fetched to the non-BIQs in the non-BI fetch units if the fetched non-BIs and/or NIs in the non-BIQs are changed; and transmit decoded information of the BIs to fetch associated non-BIs and/or NIs from the non-BI prefetch/fetch systems to the non-BI fetch units or to the non-BIQs in the non-BI fetch units if the non-BIQs are used.

17. The method of claim 14, wherein the BLA branch prediction units are operable to:

receive information for branch prediction from the BI decode units;

access other information for branch prediction from a single or plurality of other units including the branch predictor and the history table;

produce new NPC values for prefetching and fetching BIs from the BLA systems whenever a single or plurality of branch target addresses is obtained via the BLA branch prediction units in the BLA systems;

transmit the new NPC values for prefetching and fetching BIs to the BI fetch units whenever a single or plurality of branch target addresses is produced; and update necessary information for branch prediction to associated sub units including the branch predictor and the history table.

18. The method of claim 14, wherein a single or plurality of non-BI fetch/decode units is operable to:

fetch sequentially and/or concurrently the non-BIs and/or NIs addressed by associated non-BPCs and/or NPCs from the non-BI memories via the levels of non-BI caches;

fetch the non-BIs and/or NIs from locations addressed by program counters in the non-BI fetch units whenever associated non-BPCs and/or NPCs in the non-BI fetch units are updated with new NPC values by decoding fetched BIs with the BI fetch units;

fetch the non-BIs and/or NIs from locations received by NPC values from branch prediction units whenever a single or plurality of branch target addresses is obtained via the BLA branch prediction units;

fetch the non-BIs and/or NIs from locations addressed by interrupt processing units in backend microprocessors;

fetch the non-BIs and/or NIs from locations addressed by backend processing engines in the backend microprocessors for correcting mispredicted branches;

fetch variable-length NIs from the NPC values stored in the NPCs in the non-BI fetch units;

fetch non-BIs and/or NIs from the non-BIQs and/or NIQs to the non-BI decode units if the non-BIQs are used;

store the fetched non-BIs and/or NIs to a single or plurality of entries of the non-BIQs and/or NIQs in a same non-BI and/or NI fetch order if the BIQs are used;

store the fetched NIs to a single or plurality of entries of the NIQs in a same NI fetch order if the BIQs are not used;

forward the fetched non-BIs and/or NIs in the non-BIQs and/or NIQs to the non-BI decode units in the BLA systems if the BIQs are used;

adjust access pointers of the non-BIQs and/or NIQs for writing next fetched non-BIs and/or NIs to and reading next decoded non-BIs and/or NIs from the non-BIQs and/or NIQs;

update next non-BI and/or NI addresses to the non-BPCs and/or NPCs in the non-BI fetch units if current non-BIs and/or NIs do not represent any branch instructions fetched;

update the non-BPCs and/or NPCs with a single or plurality of addresses of the non-BIs and/or NIs at the branch target locations if the current non-BIs and/or NIs represent branch instructions fetched;

receive branch prediction results available a single or plurality of clock cycles ahead from the BLA branch prediction units;

receive a single or plurality of NPC values of non-BPCs and/or NPCs for performing disrupted operations of the non-BI and/or NI fetch and/or decode orders;

update new NPC values to the non-BPCs and/or NPCs to prefetch and/or fetch the non-BIs and/or NIs from disrupted locations;

restore NPC values of the non-BPCs and/or NPCs stored in a stack to the non-BPCs and/or NPCs;

forward again a same fetched non-BI and/or NIs representing a single or plurality of loops in the non-BIQs and/or NIQs to the non-BI decode units according to branch prediction results received;

hold the non-BI and/or NI fetch operations for fetching any non-BIs and/or NIs from the non-BI prefetch/fetch systems whenever forwarding the same fetched non-BIs and/or NIs representing a single or plurality of loops in the non-BIQs and/or NIQs to the non-BI decode units;

fetch a single or plurality of non-BIs and/or NIs fetched sequentially or concurrently from the non-BI memories and caches via the non-BI prefetch/fetch systems;

store the fetched non-BIs and/or NIs sequentially or concurrently through a single or plurality of entries of the non-BIQs and/or NIQs;

dispatch the fetched non-BIs and/or NIs sequentially or concurrently from a single or plurality of entries of the non-BIQs and/or NIQs to the non-BI decode units;

fetch and dispatch a single or plurality of non-scaled non-BIs and/or NIs sequentially;

fetch and dispatch a single or plurality of scaled non-BIs and/or NIs concurrently;

fetch a single non-scaled non-BI per non-BI fetch cycle in the non-BI fetch order to a single entry of non-BIQ;

fetch a plurality of non-scaled non-BIs per non-BI fetch cycle in the non-BI fetch order to a same plurality of entries of a single non-BIQ or to a same plurality of single entry non-BIQs;

fetch a single scaled non-BI per non-BI fetch cycle in the non-BI fetch order to a single entry of non-BIQ for variable-length NIs;

fetch a plurality of scaled non-BIs per non-BI fetch cycle in the non-BI fetch order to a same plurality of entries of a single non-BIQ or to a same plurality of single entry non-BIQs for variable-length NIs;

hold a single or plurality of current non-BI and/or NI addresses to fetch the non-BIs and/or NIs from the non-BI caches and/or memories via the non-BI prefetch and fetch systems to the non-BI fetch units in the BLA systems;

update the single or plurality of next non-BI and/or NI addresses if the current non-BIs and/or NIs do not represent any branch instructions fetched;

update the single or plurality of addresses of the non-BIs and/or NIs at branch target locations if current non-BIs and/or NIs represent branch instructions fetched;

update a single or plurality of current or next non-BPCs' and/or NPCs' values to a stack in order to resume the disrupted non-BI and/or NI operations;

retrieve the NPC values stored in the stack to the non-BPCs and/or NPCs after the disrupted operations are completed;

fetch a single or plurality of NIs fetched sequentially or concurrently from the non-BI memories and caches via the non-BI prefetch/fetch systems if any BIs are not fetched;

store the fetched NIs sequentially or concurrently through a single or plurality of entries of the NIQs if any BIs are not fetched;

dispatch the fetched a single or plurality of NIs sequentially or concurrently from a single or plurality of entries of the NIQs to the non-BI decode units if any BIs are not fetched;

fetch and dispatch a single or plurality of NIs sequentially if any BIs are not fetched;

fetch a single non-scaled NI per native fetch cycle in the NI fetch order to a single entry of NIQ for fixed-length NIs;

fetch a plurality of non-scaled NIs per native fetch cycle in the NI fetch order to the same plurality of entries of a single NIQ or to the same plurality of single entry NIQs for fixed-length NIs;

fetch a single scaled NI per native fetch cycle in the NI fetch order to a single entry of NIQ for variable-length NIs;

fetch a plurality of scaled NIs in a plurality of bytes per native fetch cycle in the NI fetch order to a same plurality of entries of a single NIQ or to a same plurality of single entry NIQs for variable-length NIs;

hold a single or plurality of current NI addresses to fetch the NIs from the non-BI caches and/or memories via the non-BI prefetch and fetch systems to the non-BI fetch units in the BLA systems if any BIs are not fetched;

update a single or plurality of next NI addresses if current NIs do not represent any branch instructions fetched if any BIs are not fetched;

update a single or plurality of addresses of the NIs at branch target locations if current NIs represent branch instructions fetched if any BIs are not fetched;

update a single or plurality of current or next NPCs' values to a stack in order to resume disrupted NI operations if any BIs are not fetched;

retrieve the NPC values stored in the stack to the NPCs after the disrupted operations are completed if any BIs are not fetched;

receive a single or plurality of fetched non-BIs and/or NIs from the non-BI fetch units in the BLA systems;

decode the fetched non-BIs and/or native conditional branch instructions to provide new values of the non-BPCs and/or NPCs for fetching the non-BIs and/or fixed- and variable-length NIs to the non-BI fetch units;

screen any non-BIs and/or NIs required to be predicted their branch operations and branch target locations if any BIs are not fetched;

forward information for branch prediction to the non-BIs and/or native branch prediction units if any BIs are not fetched;

filter non-BIs and/or NIs representing a single or plurality of loops while forwarding same non-BIs and/or NIs representing a same single or plurality of loops to the non-BI and/or native branch prediction units if any BIs are not fetched; and transmit decoded information of the non-BIs and/or NIs to fetch associated non-BIs and/or NIs from the non-BI prefetch/fetch systems to the non-BI fetch units if any BIs are not fetched or to the non-BIQs in the non-BI fetch units if the non-BIQs are used and any BIs are not fetched.

* * * * *